US 6,300,231 B1

(12) United States Patent
Haba et al.

(10) Patent No.: US 6,300,231 B1
(45) Date of Patent: Oct. 9, 2001

(54) METHOD FOR CREATING A DIE SHRINK INSENSITIVE SEMICONDUCTOR PACKAGE AND COMPONENT THEREFOR

(75) Inventors: Belgacem Haba, Cupertino; John W. Smith, Palo Alto, both of CA (US)

(73) Assignee: Tessera Inc., San Jose ( * ) Notice: Subject to any disclaimer, the term of this patent is extended or adjusted under 35 U.S.C. 154(b) by 0 days.

(21) Appl. No.: 09/322,217

(22) Filed: May 28, 1999

Related U.S. Application Data

(60) Provisional application No. 60/087,286, filed on May 29, 1998, and provisional application No. 60/088,519, filed on Jun. 8, 1998.

(51) Int. Cl.[7] .................................................. H01L 21/44
(52) U.S. Cl. .......................................... 438/597; 438/118
(58) Field of Search ................................... 438/118, 119, 438/127, 597, 110, 123, 543; 257/787, 795, 666, 668

(56) References Cited

U.S. PATENT DOCUMENTS

| | | | |
|---|---|---|---|
| 3,805,375 | * 4/1974 | LaCombe et al. | 29/577 |
| 5,068,714 | * 11/1991 | Seipler | 357/80 |
| 5,390,844 | 2/1995 | DiStefano et al. | 228/180.21 |
| 5,489,749 | 2/1996 | DiStefano et al. | 174/261 |
| 5,629,239 | 5/1997 | DiStefano et al. | 216/14 |
| 5,659,952 | 8/1997 | Kovac et al. | 29/840 |
| 5,679,977 | 10/1997 | Khandros et al. | 257/692 |
| 5,776,796 | 7/1998 | DiStefano et al. | 438/106 |
| 5,868,301 | 2/1999 | DiStefano et al. | 228/180.21 |
| 6,048,656 | * 4/2000 | Akram et al. | 430/118 |
| 6,081,035 | 6/2000 | Warner et al. | 257/773 |
| 6,127,724 | 10/2000 | DiStefano | 257/675 |

* cited by examiner

*Primary Examiner*—David Nelms
*Assistant Examiner*—Phuc T. Dang
(74) *Attorney, Agent, or Firm*—Lerner, David, Littenberg, Krumholz & Mentlik, LLP

(57) ABSTRACT

A method of connecting a substrate to a semiconductor chip and component therefor to allow for the packaging of a chip even after successive die shrinks. The method compensates for successive die shrinks by providing a substrate that has connection sections of electrical leads that are releasable and/or be displaceable from a surface of the substrate as a result of a force from a bonding tool on the connection sections through at least one substrate aperture. A contact bearing surface of a semiconductor chip may then be aligned with the substrate so that the connection sections are in general alignment with the chip contacts. The connection sections may then be displaced and bonded to respective chip contacts. Other methods may be used to ensure that the chip, after die shrink, fits within the same package such as aligning the chip asymmetrically with the substrate and designing the location and dimensions of the substrate apertures so that the connection sections can be in alignment with the chip contacts.

41 Claims, 15 Drawing Sheets

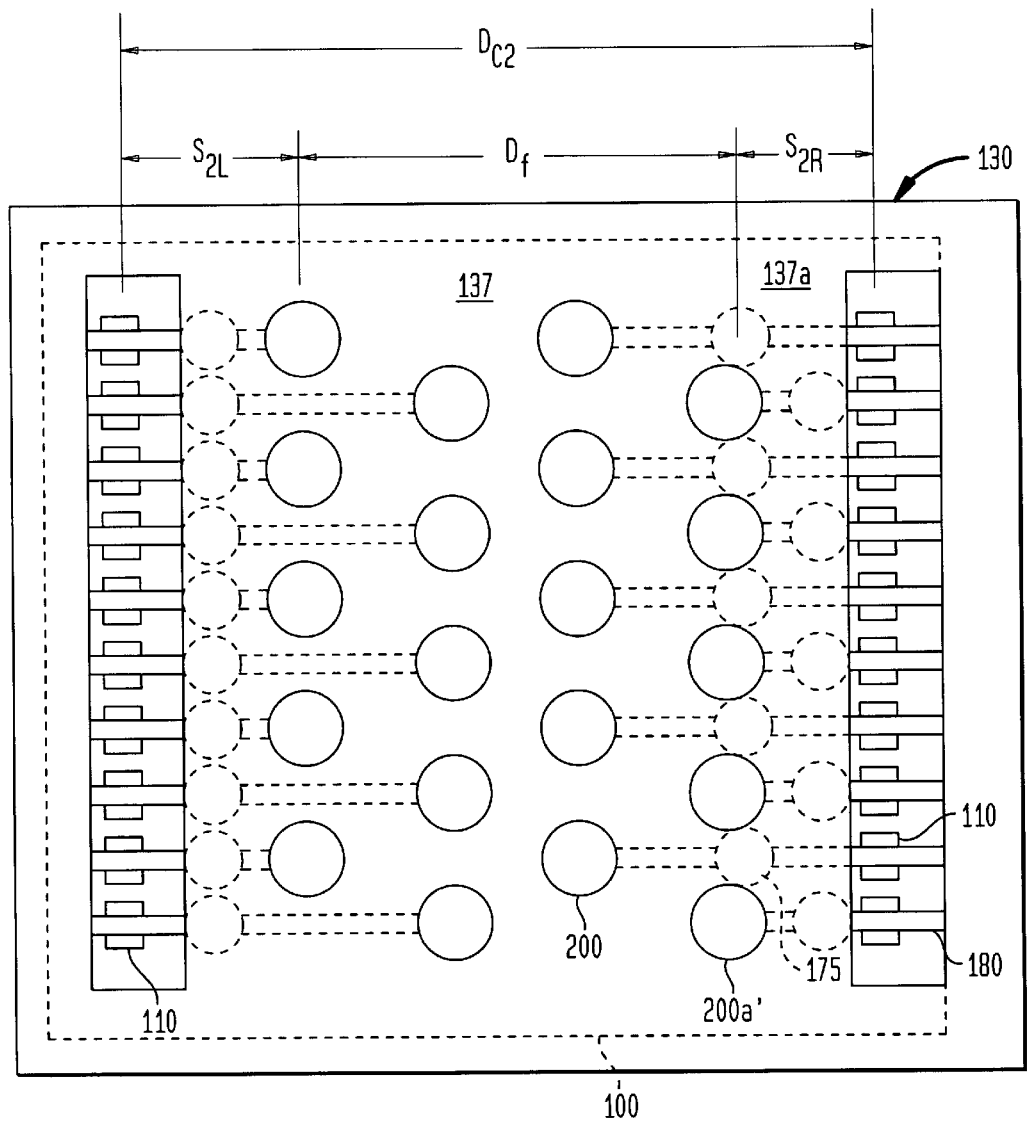

US 6,300,231 B1

METHOD FOR CREATING A DIE SHRINK INSENSITIVE SEMICONDUCTOR PACKAGE AND COMPONENT THEREFOR

CROSS REFERENCE TO RELATED APPLICATIONS

The present application claims benefit of U.S. Provisional Patent Application No. 60/087,286 filed May 29, 1998 and No. 60/088,519 filed Jun. 8, 1998. The disclosures of said applications are incorporated by reference herein.

BACKGROUND OF THE INVENTION

The present invention relates to components useful in making electrical connections to microelectronic elements such as semiconductor chips, and to methods of manufacturing such components.

FIG. 1 shows a specific semiconductor package marketed by the present assignee under the registered trademark μBGA. In short, the figure shows a semiconductor chip having contacts 110 on a face surface 120. A flexible, dielectric substrate 130 overlies and is juxtaposed with the face surface 120 of the chip 100. The substrate 130 has a first surface 150 facing away from the chip 100, and a second surface 160, facing towards the chip 100. The substrate 130 further has conductive leads 170 running along the second surface 160. Each lead has a connection section 180 extending across a bonding window 190. The connection sections 180 are releasably attached to the substrate, as described in U.S. Pat. Nos. 5,489,749 and 5,629,239 hereby incorporated by reference herein. Each lead terminates in a conductive terminal 200 which is exposed at or overlies the first surface 150 of the substrate 130. A compliant layer 140 is disposed between the substrate 130 and the face surface 120 of the chip 100. In this embodiment, the compliant layer 140 takes the form of a plurality of compliant pads 140, as described in U.S. Pat. No. 5,659,952 hereby incorporated by reference herein. The leads are detached and bonded to respective chip contacts 110, such as by thermocompression or ultrasonic bonding techniques. The bond windows are then covered by a coverlay or soldermask (not shown) and a liquid encapsulant 210 is dispensed or injected into and between the substrate 130 and the chip 100, as described more fully in U.S. patent application Ser. No. 08/726,697 incorporated by reference herein. The encapsulant 210 is then cured and solder balls 220 are connected to the terminals 200 and the package is cut to size, as shown, for future connection to a printed wiring board ("PWB").

As the chip 100 heats up and cools down in operation, it expands and contracts at an inherent rate, called its coefficient of expansion ("CTE"). The CTE of silicon is approximately 2.7 to 3.0 parts per million per degree Celsius. As the chip heats up and cools down in operation, the underlying PWB also heats up and cools down (and thereby expands and contracts) in response to the chip 100. However, the CTE of standard epoxy/fiberglass PWBs is approximately 15 to 20 parts per million per degree Celsius causing a mismatch in the expansion and contraction between the chip and the PWB. The construction of the package shown in FIG. 1 mechanically decouples the chip from the underlying PWB to allow for movement of the terminals 200/solder balls 220 with respect to the chip contacts 110 thereby allowing the chip to expand and contract at one rate and the PWB to expand and contract at another rate without the mechanical connection fatiguing and becoming unreliable due to the thermal mismatch, as explained more fully in U.S. Pat. No. 5,679,977 hereby incorporated by reference herein.

In this type of chip package construction, it is typically better, from a reliability stand-point, for the connection section 180 of the leads 170 to have a gradual radius of curvature both at the heel of the connection section 180 (near where it connects to the chip contact 110) and at the shoulder of the connection section 180 (near where it connects to the substrate 130). Such a gradual radius of curvature better ensures that the connection section 180 does not hinge about a single point or area as it is flexing in response to the thermal mismatch phenomenon described above. To create such a gradual radius of curvature for the connection sections 180, the connection sections 180 must be a certain minimum length which depends on the stand-off (or vertical height) from the face surface 120 of the chip 100 to the second surface 160 of the substrate 130. This connection section 180 minimum length also sets the allowable minimum dimension ($D_W$) for the bonding window 190. Likewise, the minimum dimension $D_W$ for the bonding window 190 limits the amount of area ($D_S$) on the first surface 150 of the substrate 130 that is available for terminals 200. Typically, the preferred terminal 200 center to center distance (or "pitch") is somewhere between 0.8 and 0.65 millimeters with a typical terminal size of 275 μm to 300 μm and a solder ball 220 diameter of approximately 300 μm to 350 μm. On some package designs, it is permissible to use a terminal pitch of 0.5 millimeters which allows more terminals to be placed in the same substrate area $D_S$. The major constraint on using a pitch of 0.5 millimeters or below is that most inexpensive PWYBs cannot be wired to receive contacts at such a fine pitch so more expensive substrates must be used.

FIGS. 2 and 3 show fragmentary side views of a chip package similar to the package shown in FIG. 1. In FIG. 2, the length of the bonding window 190a and therefore the connection section 180a have been shortened to $D_{W1}$, when compared to the bonding window 190b ($D_{W2}$) and connection section 180b of FIG. 3. As explained above, this shorter connection section 180a has a larger radius of curvature at the heel and shoulder of the connection section 180a and may also have a less reliable response to thermal cycling. In many packaging applications, the shorter connection section shown in FIG. 2 may have acceptable reliability characteristics. However, it is preferred to have the longer connection section 180b of the type shown in FIG. 3 because it has been found that such leads are more reliable over a longer period of time and/or under greater thermal mismatch conditions.

Another issue with respect to a larger bonding window 190b ($D_{W2}$) is that the bonding window 190 may get in the way of the locations of the terminals 200 as the semiconductor manufacturer shrinks the size of its chips which causes the locations of the chip contacts to move. Semiconductor manufacturers fabricate a plurality of semiconductor chips en mass in a unitary, planar structure called a wafer. The chips are typically separated from each other later prior to the packaging operation. Typically, a semiconductor manufacturer will endeavor to take its original design for a particular semiconductor chip 100 and change it so that the same or better functionality are placed into a smaller first surface 120 area. This allows the semiconductor manufacturer to fit more chips into a single wafer. Since the cost of processing wafers is approximately constant, this process of reducing the chip size provides more chips for less manufacturing cost per chip. As a general rule of thumb, most chip shrinks are about 20% (or more) smaller than the size of the original chip and typically the chip manufacturers only perform two or three chip shrinks before discontinuing a particular chip type in favor of a new design or technology;

although, some chip makers perform more chip shrinks before going to a completely new chip design depending on the aggressiveness of the chip maker and the type of die.

As the chip shrinks and the chip contacts move inward from their original locations, the bonding windows 190 and connection sections 180 in the chip package shown in FIG. 1 also have to move to compensate for the chip contact 110 movement. If the bonding windows need to be moved into the area $D_S$ on the first surface 150 of the substrate 130 that is occupied by the terminals 200, the terminal pitch and arrangement may no longer be uniform with the last version of the chip package. This causes the PWB manufacturer to have to re-design the PWB to account for the movement of the terminals 200/solder balls 220. One method of compensating for the problems that are encountered because of a chip shrink is to place the chip face up on the supporting substrate so that the chip contacts face away from the package terminals and are connected to the substrate terminals by standard wire-bonds and routing leads on a surface of the substrate. Such a face-up package variation has many useful attributes (as are described in U.S. patent application Ser. No. 08/962,988 incorporated by reference herein); however, the resulting package is generally larger and thicker than the package shown in FIG. 1.

Therefore, while the above mentioned package designs are important improvements to packaging technology, it is desirable to find a method of shortening the bonding window 190 and/or otherwise compensating for the problems encountered because of chip shrink without negatively affecting the reliability of the connection sections 180 of the leads 170 or the pitch and arrangement of the exterior package terminals.

SUMMARY OF THE INVENTION

The present invention discloses a method of connecting a substrate to a semiconductor chip and component therefor to allow for the packaging of a chip even after successive die shrinks.

The method includes providing a chip having contacts on a face surface and a dielectric substrate having a top surface facing away and a bottom surface facing towards the face surface of the chip and at least one aperture therethrough. The substrate may be rigid or flexible and has terminals exposed at its top surface. The substrate further has conductive connection sections adjacent a portion of the bottom surface of the substrate and being releasably connected thereto. Each connection section extending at least partially across the substrate aperture. The connection sections further being a substrate terminal by a conductive lead on said substrate. The chip face surface and the substrate bottom surface are then aligned so that the chip contacts are disposed within the at least one substrate aperture and displacing and bonding said connection section to a chip contact, wherein the connection section is moved away from said substrate bottom surface toward the face surface of the chip during the displacement operation. In some embodiments, the chip and the substrate may be juxtaposed with one another so that they are in an asymmetrical relationship.

Typically, the substrate connection sections are made releasable by removing or degrading a portion of material from between the connection section and the substrate bottom surface. This may be accomplished by directly etching the substrate bottom surface. In some embodiments, a technique such as plasma etching can be used to preferentially etch the substrate beneath and around the connection sections. In alternate embodiments, a separate layer may be disposed between the substrate bottom surface and the connection sections. This separate layer may then be etched such that the adherence of the connection sections is removed or degraded. The separate layer may be a conductive layer such as copper, or may be a dielectric layer, such as an adhesive layer.

The present invention further contemplates a component for manufacturing a semiconductor package. This component includes a dielectric substrate having a top surface and a bottom surface and at least one aperture therethrough. The substrate further has terminals exposed at its top surface and connection sections adjacent a portion of the bottom surface of the substrate. The connection sections are releasably connected to the substrate bottom surface. The connection sections further extend at least partially across the at least one substrate aperture and are connected to said terminals by conductive leads. In certain embodiments, the substrate may have an anchor portion between said leads and said connection sections where the anchor portion has a greater adherence to the surface of the substrate than the connection section. The anchor may have greater adherence to the substrate because it has a larger surface area per unit length than the connection section. In an alternative embodiment, the anchor may be a conductive via extending from the bottom surface to the top surface of the substrate.

BRIEF DESCRIPTION OF THE DRAWINGS

FIGS. 12 and 13 show a top plan view of a fan-in semiconductor chip package, similar to the view show in FIG. 6B, except that the semiconductor chip is smaller in each successive figure, according to the present invention.

DETAILED DESCRIPTION OF PREFERRED EMBODIMENTS

Figure 1:
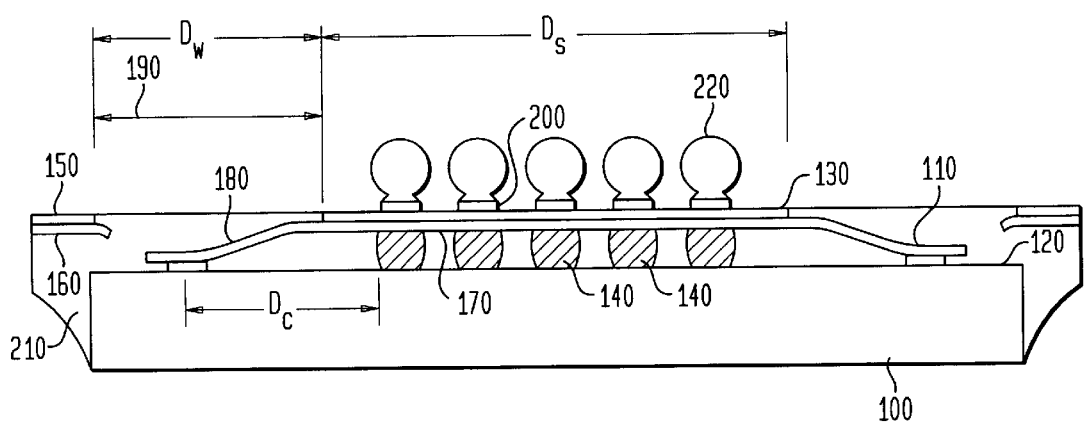
FIG. 1 show a side view of a prior art semiconductor chip package.
Figure 2:
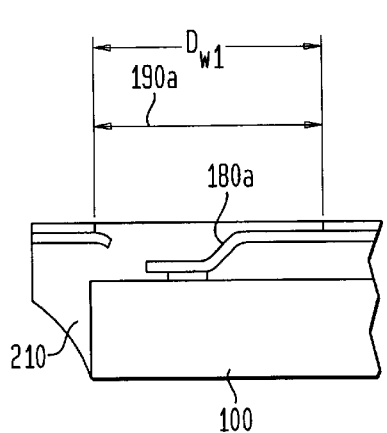
FIGS. 2 and 3 show fragmentary side views of semiconductor chip package similar to the package shown in FIG. 1.
Figure 3:
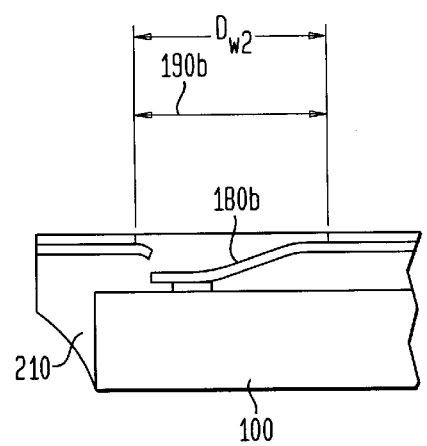
Figure 4:
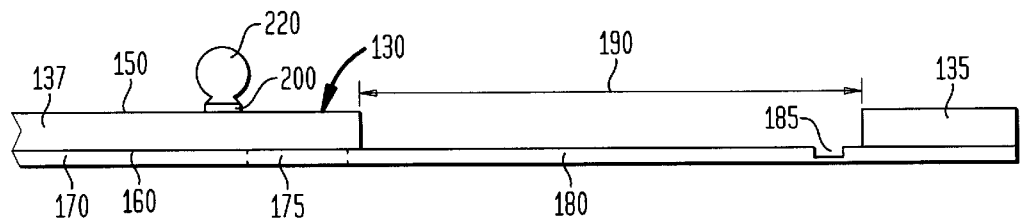
FIG. 4 shows a fragmentary side view of a prior art dielectric substrate for use in a semiconductor chip package.
Figure 8:
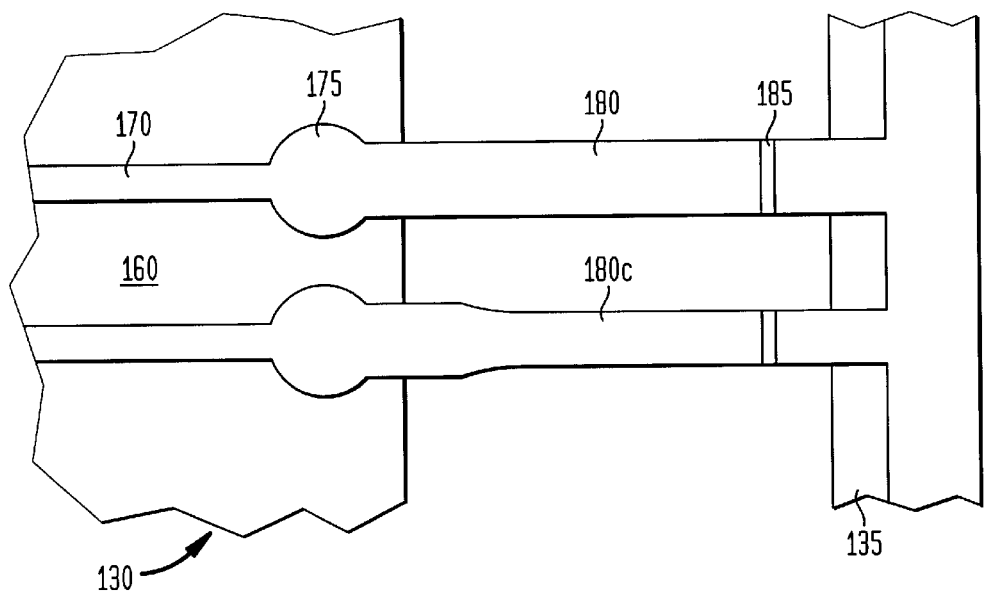
FIG. 8 shows a fragmentary top plan view of a prior art dielectric substrate for use in a semiconductor chip package.

FIG. 4 shows a magnified fragmentary side view and FIG. 8 shows a magnified fragmentary top plan view of a prior art dielectric substrate 130 prior to attachment to a chip 100 in a fan-in chip package embodiment, such as is shown in FIG. 1 where all of the terminals 200 are within the periphery of the chip 100. As shown in FIG. 4 and FIG. 8, the substrate 130 is typically a flexible, substantially inextensible sheet-like structure, such as polyimide, epoxy or other suitable alternative, having a typical thickness of approximately 25 μm to 75 μm. In some applications the substrate 130 may also be rigid, such as a conventional BT resin substrate. The substrate 130 has at least one bonding window 190 extending therethrough from a first or top surface 150 to a second or bottom surface 160. The substrate further has electrically conductive terminals 200 on the first surface 150 and electrically conductive leads 170 on the second surface 160. The leads 170 have connection sections 180 extending across the bonding windows 190 and releasably attached to the substrate on the peripheral region of the substrate 135. In this embodiment, the connections have a lateral notch 185 extending thereacross for detachment in response to the exertion of force by a bonding tool in the direction of the chip contact (as shown by the dashed lines in FIG. 6A). The leads further have an anchor 175 having a larger cross-sectional area per unit length than the lead 170 to better ensure that when the connection sections are detached, deflected downwardly and bonded to the chip contacts 110, the leads 170 do not delaminate from the substrate second surface 160, as better explained in U.S. patent application Ser. No. 08/736,415, incorporated by reference herein. Electrical connection between the terminals 200 and the leads 170 may be made by a conductive via through the substrate 130 or the terminals themselves may be located on the second surface 160 of the substrate 130 and an aperture (having a diameter less than the diameter of the terminal 200) may be made through the substrate, such as through a punching, chemical etching or laser ablation operation, so that the solder ball 220 may be placed on the terminal 200 for later connection to the PWB. As shown in FIG. 8, the connection sections 180c of the leads 170 may be tapered along the length of the connection section. The tapering of the connection section allows the lead to take a predictable radius of curvature during the lead bonding operation, described above.

Figure 5:
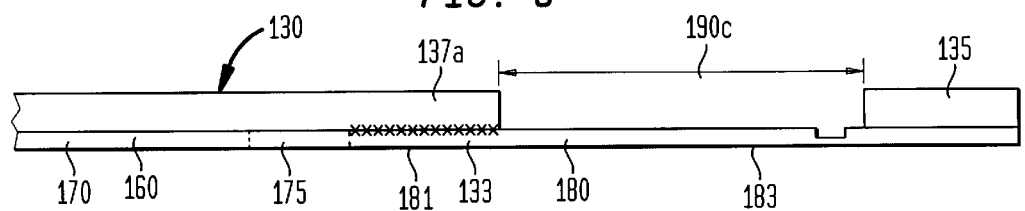
FIG. 5 shows a fragmentary side view of a circuitized dielectric substrate according to the present invention.
Figure 6A:
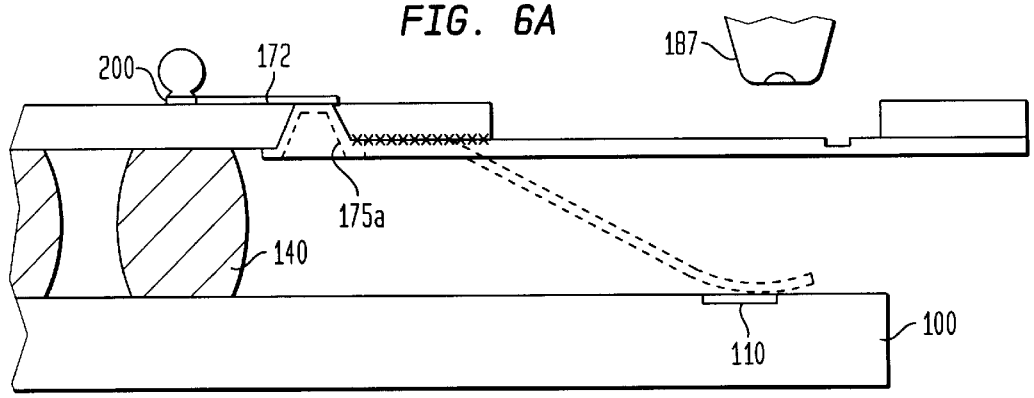
FIG. 6A shows a fragmentary side view of the substrate shown in FIG. 5 attached to a semiconductor chip in a partially constructed state according to the present invention.
Figure 6B:
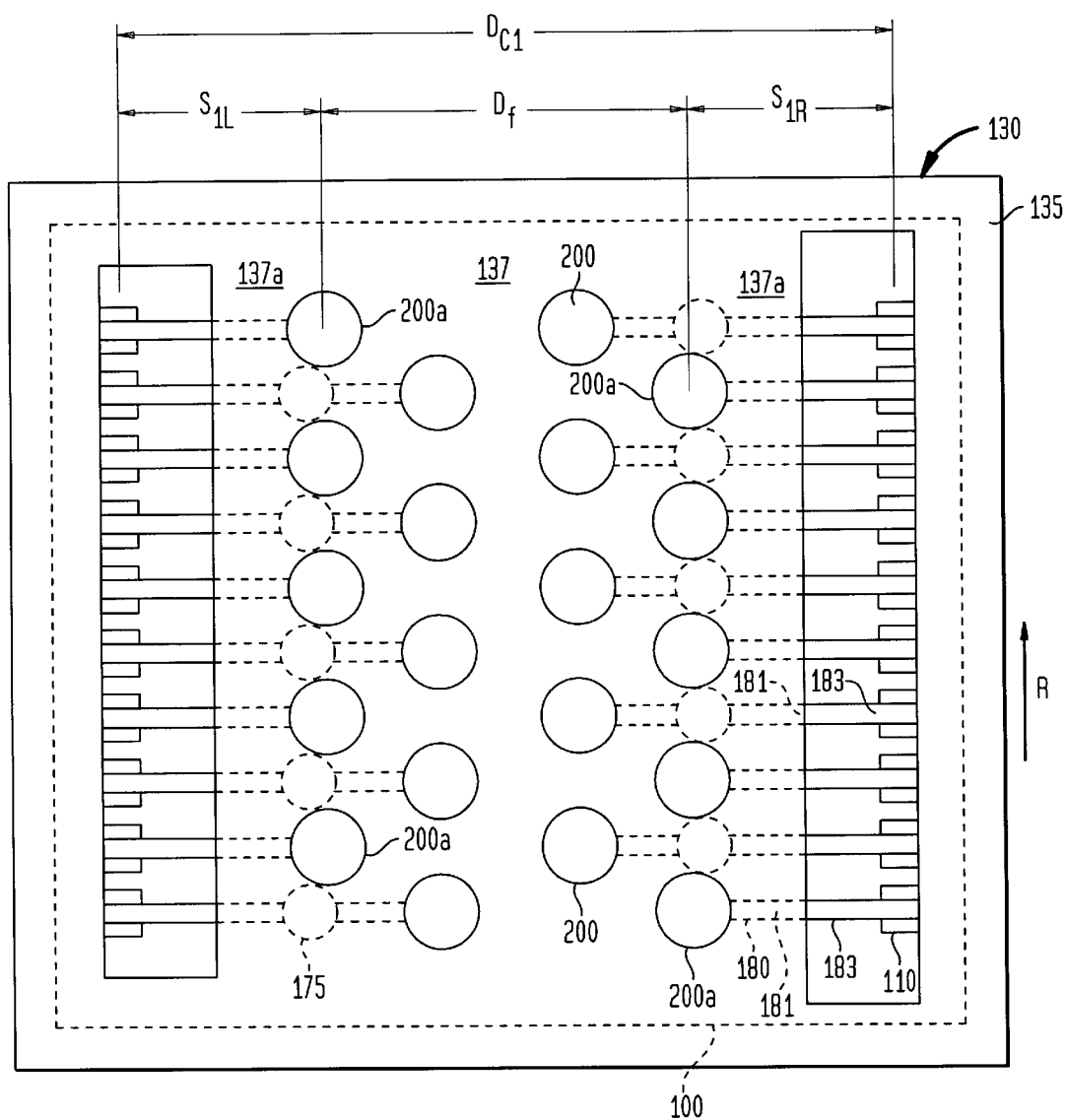
FIG. 6B shows a top plan view of a semiconductor chip package according to the present invention.

FIG. 5 shows a magnified fragmentary side view of a metallized dielectric substrate 130 according to one embodiment of the present invention. The substrate 130 is similar to the substrate in FIG. 4 except that the central region 137 of the substrate 130 has been extended into the bonding window 190c area (portion 137a), shortening the width of the bonding window 190c. The length of the connection section 180 of the lead 170, however, has been retained by allowing a first portion 181 of the connection section 180 under the extended portion 137a of the substrate 130 to be removeably attached to the second surface 160 of the substrate 130. A second portion 183 of the connection section is aligned with the smaller bond window 190c. Stated another way, the second portions 183 of the connection sections project from dielectric substrate 130, so that the second portions can be engaged by a tool moving downwardly, such as tool 187 (FIG. 6A). The second portion 183 of the connection section is electrically connected to the remainder of the lead, and hence to the terminal 200 (FIG. 6B) through the first portion of the connection section. The connection sections 180, including the second portions 183 of the connection sections, are arranged in two rows extending generally parallel to one another in a row direction R (towards the top of the drawing as seen in FIG. 6B). The connection sections 180 of the leads in each row, and particularly the second portions 183 of the connection sections, extend in directions generally transverse to the row direction. The terminals 200 are also arranged in rows extending in the row direction.

As compared to the component of FIG. 4, the component of FIGS. 5–6 has a smaller bonding window 190c while retaining the length of the downwardly displaceable connection sections 180 of the leads. This in turn maintains the gradual radius of curvature both at the heel of the connection section 180 (near where it connects to the chip contact 110) and at the shoulder of the connection section 180 (near where it connects to the substrate 130), when the connection section is bent downwardly to engage a chip contact as shown in FIG. 6A. The interface between the connection section and the extended portion 137a of the substrate 130 may be weakened or removed, as shown by the darkened portion 133, by any number of operations.

Figure 10A:
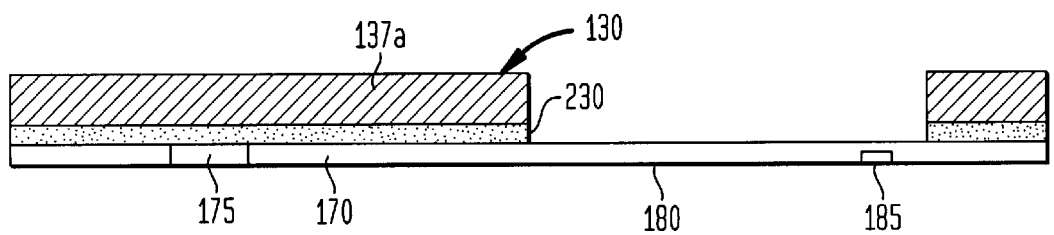
FIGS. 10A and 10B show one method of removing the interface between a substrate and a connection section of an electrical lead within a package according to the present invention.
Figure 10B:
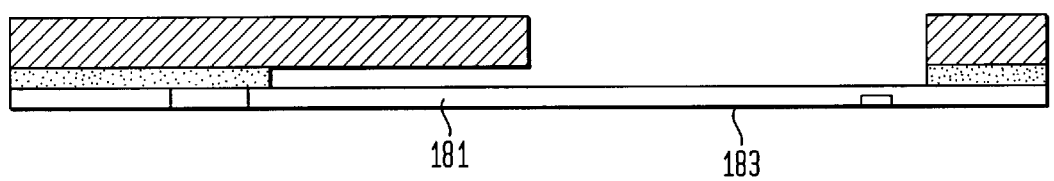

FIGS. 10A and 10B show one method of removing the interface between the substrate 130 and the first portion 181 of the connection section 180. In one embodiment, a layer 230 can be selectively removed from beneath the connection section 180, as described above. Layer 230 may be comprised of any conductor or dielectric material which can be removed without substantial damage to the leads 170, connection sections 180 or substrate 130. In one embodiment, layer 230 is a conductive layer such as copper which is readily removed by etching in standard etching bath solutions and the lead material is comprised of a material which is not readily removed by the etchant used to remove the copper. One such lead 170 material is gold. The copper layer 230 is selectively etched such that the connection section beneath the extended-portion 137a of the substrate 130 is removed. In another embodiment, layer 230 is an adhesive layer which adheres the leads 170 to the second surface of the substrate 130, similar to conventional laminated tape automated bonding substrate material (so called "TAB" material). It has been found that such an adhesive layer 230 can be readily etched using a plasma gas etchant, similar to the disclosure in U.S. patent application Ser. No. 09/020, 750, incorporated by reference herein. Using this technique, the plasma gas typically etches adhesive layer 230 faster than it etches the other elements in the assembly, such as the leads or the substrate. In the tests preformed, the leads were comprised of copper or copper with a gold plated exterior and the substrate was comprised of polyimide. In some embodiments, it may be desirable to provide a mask (such as a soldermask material) over the leads 170 and other features of the substrate 130 such that only the connection sections below the extending portion of the substrate 137a are exposed. In this way, the adhesive below the exposed connection sections 180 may be degraded or etched completely away without affecting the adherence of the other conductive features to the substrate 130.

Figure 11A:
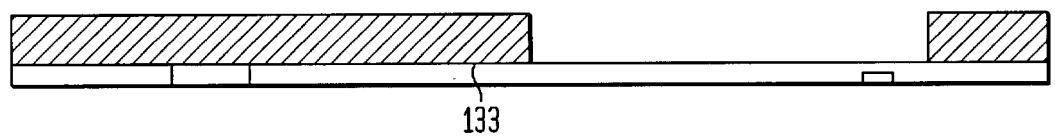
FIG. 11A shows a substrate for the packaging of a semiconductor chip.
Figure 11B:
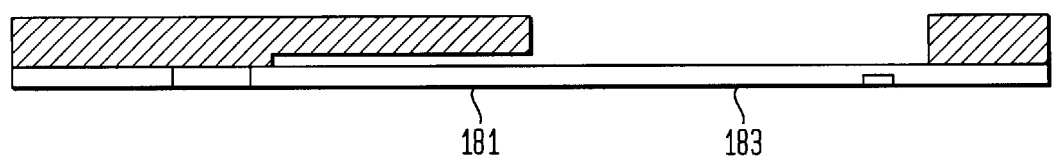
FIGS. 11B and 11C show the substrate in FIG. 11A after an interface between the substrate and a connection section of an electrical lead has either been removed or has been degraded, respectively, according to the present invention.
Figure 11C:
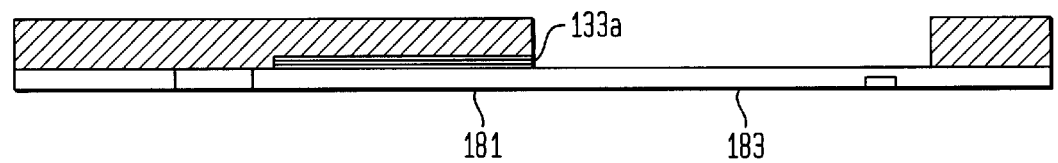

FIG. 11A shows an embodiment in which there is no layer 230 between the leads 170 and the substrate 130, such as where the conductive features of the substrate have been additively provided on the substrate, as by sputtering and/or plating techniques. FIG. 11B shows an alternate method of removing the interface between the extended portion 137a and the first portion 181 of connection section 180 of the lead 170. In this method, the interface 133 is selectively removed in a controlled manner by exposing the extended portion 137a of the substrate 130 while typically covering all other portions of the substrate which might be affected (using a glass or metal etch mask) and preferentially etching the interface 133 away using a means which will remove the dielectric substrate without removing the lead material, such as with a plasma gas etchant, as described in more detail in the U.S. patent application Ser. No. 09/020,750 discussed above. FIG. 11C shows yet another method for weakening the interface 133 between the extended portion 137a of the substrate 130 and the first portion 181 of the connection section 180 by performing a preferential etching operation, as in FIG. 11B, but stopping the etching operation prior to completely removing the substrate from underneath the connection section 180 such that a rib 133a of substrate 130 material is still attached to the connection section 180 under the extended portion 137a. In this embodiment, the first portion 181 of the connection section 180 is releasably attached to the rib 133a and the first portion of the connection section may be peeled from the rib 133a of the substrate 130 during the lead bonding step when the connection section is bent downwardly as shown in FIG. 6A. The method described with regard to FIG. 11C is also described in more detail in U.S. patent application Ser. No. 09/020, 750. It is thought that the creation of a rib 133a of attachment material for the connection sections 180 can also be used with the TAB substrate embodiment, discussed above with reference to FIGS. 10A and 10B. In such an embodiment, the adhesive adhering the connection sections 180 would only be partially degraded such that the connection sections can be more easily "peeled" away from the extended portion 137a of the substrate 130 during a lead bonding operation.

In the examples described above with reference to FIGS. 10A–B and 11A–C, the method used to release the first portions 181 of connection sections 180 from the extended portions 137a should not have a substantial effect on the other elements of the assembly. In an embodiment where it is desirable not to use a mask to cover the leads 170 and other conductive features, an etchant should be selected so that it preferentially releases or degrades the adherence of the connection sections 180 faster than it etches other elements of the assembly. Also, it may be desirable to design the connection sections 180 such that they have a smaller cross sectional area per unit length than most of the other conductive features so that it will be faster to degrade the adherence of the connection section using an etching technique than it is to degrade the adherence of the other features.

Figure 9:
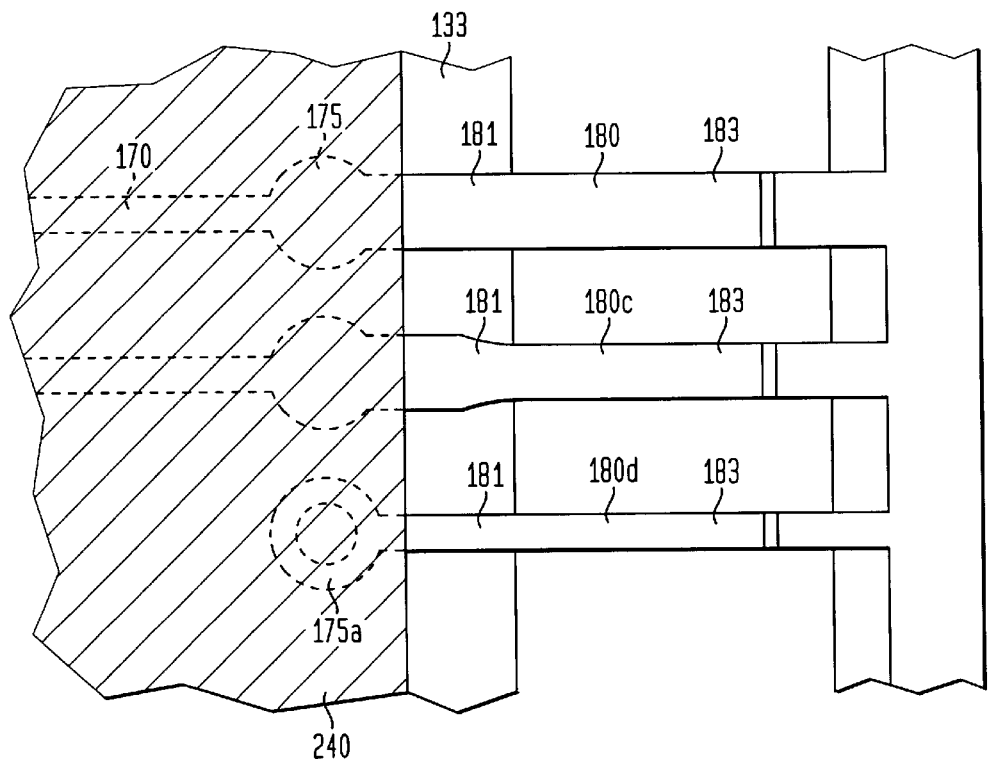
FIG. 9 shows a fragmentary bottom view of the substrate shown in FIG. 5.

FIG. 9 shows a fragmentary bottom view of the substrate shown in FIG. 5. FIG. 9 shows several alternate connection sections, i.e. a wide straight lead, a tapering lead and a narrow straight lead. All such lead designs would work in this invention; however, because the tapering lead 180c and the narrow lead 180d have first portions 181 with smaller cross-sectional areas in contact with the substrate 130, it will be easier to remove material under the first portions of connection sections 180c, 180d. If a peelable connection is formed (as described in reference to FIG. 11C) the leads will more readily peel from the second surface 160 of the substrate 130.

Figure 7:
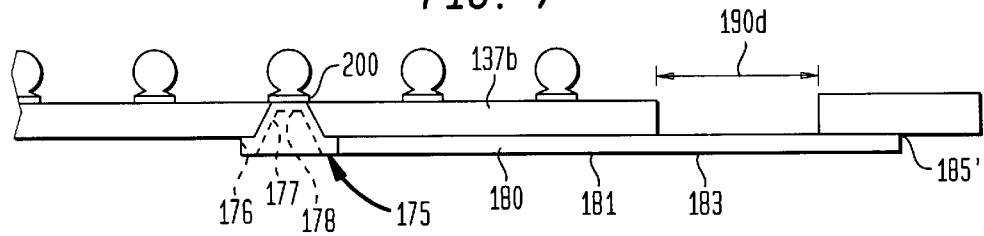
FIG. 7 shows a fragmentary side view of a circuitized dielectric substrate according to the present invention similar to that shown in FIG. 5 except that the extended portion of the substrate is larger and the bond window has been further minimized.

FIG. 9 also shows one form of a lead anchor 175a which is used as the means to electrically connect the leads 170 on the second surface 160 to the leads and/or terminals 200 on the first surface 150 of the substrate 130. Lead anchor 175a is a blind via structure which has a conical or cylindrical conductive portion 177 interconnecting a flange portion 176 (on the second surface 160) to a flat via bottom 178 such that there is a hollow central area, as also shown in the side view in FIGS. 4 and 7. As shown in FIG. 6A, anchor 175a is spaced from a terminal 200 and connected to the terminal by a further lead portion 172. As shown in FIG. 7, the anchor 175a is aligned with a terminal 200. Typically, such blind via structures are inverted such that the flat bottom portion 178 resides on the second surface 160 of the substrate 130. Here, however, the flat bottom via portion 178 has been inverted to allow a terminal 200 to sit directly on top of the via (although, either via orientation may be used-with this invention). In some embodiments the flat bottom portion 178 might be the terminal 200 itself.

FIG. 9 further shows a layer 240 (such as a coverlay or soldermask) attached to the second surface or bottom 160 of the substrate 130 covering portions of the leads 170 that should not release from the second surface of the substrate 130. If this layer is a solder mask or coverlay, it can be exposed and developed such that certain portions of it may be removed around the connection sections 180. This allows selective access to the regions of the substrate to be processed as described in reference to FIGS. 10 and 11 without the need for a metal or glass mask, as described above. Layer 240 can be left on after the lead releasing operation is performed to give the leads 170 beyond the anchor 175 greater adherence to the substrate 130 when the connection sections are being down-set and perhaps peeled therefrom in the bonding operation. An alternate method of dispensing with the need for a mask during the lead releasing operation (described in relation to FIGS. 10 and 11) is to make all of the lead anchors 175a into vias (as described in FIG. 9) and wiring the connections between the vias and their respective terminals 200 on the first surface 150 of the substrate 130. This allows the lead releasing operation to be performed on the entire second surface 160 of the substrate without a mask and without the fear that the adherence between the leads 170 and the substrate 130 will be weakened. As discussed above, it is not critical to use layer 240 if the etchant and/or conductive features are properly designed.

The lead anchors 175,175a need not be aligned adjacent one another as shown in FIGS. 8 and 9. As the pitch (center-to-center distance) of adjacent leads is minimized, it is possible that adjacent lead anchors 175,175a may either short into one another or may impede the routing of leads 170 between the adjacent anchors 175,175a. Therefore, the anchors 175,175a may be staggered such that one anchor 175,175a is positioned a distance further from its respective bonding window 190c than its immediately adjacent lead anchor 175,175a. This allows the lead 170 pitch to be further minimized or allows for more leads to be routed between adjacent lead anchors. Staggering adjacent lead anchors also allows the chip contacts 110 to be staggered thereby allowing finer pitch between adjacent chip contacts.

FIG. 6A shows a fragmentary side view and FIG. 6B a top view after the chip 100 has been attached to the substrate 130 discussed above with reference to FIG. 5. The dashed lines represent the connection section 180 after it has been detached from the substrate 130, down-set and bonded to a chip contact 110. This graphic representation shows how the connection section 180 releases from the extended portion 137a of the substrate 130 in order to maintain the optimal radius of the heel and shoulder regions of the connection section while at the same time allowing a smaller bond window 190c. Stated another way, when the second portions 183 of the connection sections are engaged by bonding tool 187 and displaced downwardly, the first portions 181 of the connection sections are also displaced downwardly away from dielectric substrate 130. It is important to note that the compliant layer 140 should be positioned such that it does not substantially impede the downward direction of the connection sections residing under the extended portions 137a of the substrate 130. The compliant layer 140 may also be a small unitary pad, or a larger unitary pad that has scalloped shaped edges which have open areas, to allow the connection sections 180 to displaced downwardly from the substrate 130. Such a unitary pad design would support the connection sections 180 during bonding but not be in the way of the connection sections as they peel or are down-set away from the second surface 160 of the substrate 130 during lead formation and bonding operation, as described above. Merely by way of example, in a preferred embodiment shown in FIG. 6, the height of the compliant layer 140 is approximately 125 μm from the chip face surface 120 to the second surface 160 of the substrate 130. The connection section 180 is approximately 300 μm long and the bonding window 190c is approximately 200 μm wide. Since the height of the compliant layer 140, the length of the connection sections 180 and the width of the bonding window are all inter-related, in other preferred embodiments, these dimensions may be different depending on the desired package characteristics.

FIG. 7 shows a side view of a similar substrate to that shown in FIGS. 5 and 6 except that the extended portion 137b of the substrate 130 is larger and the bond window 190d has been further minimized. In this embodiment, if the height of the compliant layer standoff 140 is taken into account, the length of the connection sections 180 may be easily calculated such that the desired radius of curvatures are obtained. When the connection sections 180 beneath the extended portion 137b of the substrate 130 are allowed to be longer (as shown), the amount of diagonal travel from the point on the lead that the bonding tool engages to detach the lead to the point on the lead that is bonded to the chip contact is also made smaller so that the bonding window 190d need only be wide enough to allow the bond tool (such as the tools described in U.S. Pat. No. 5,390,844 and U.S. patent application Ser. No. 08/630,375) through the bonding window to detach the connection sections 180 of the leads 170 to respective chip contacts 110. Such bonding tools 187 are typically about 75 μm to 125 μm on the side shown in FIG. 6A and may have a square, rectangular or circular face bonding surface. Therefore, the bonding window 190d is approximately 150 μm wide to allow the bonding tool to enter the window and detach the connection sections 180 and bond them to respective contacts 110. FIG. 7 also shows that the terminals 200 may reside over the extended portion 137b of the substrate 130 to allow for either more terminals 200 or a larger terminal pitch. Stated another way the terminals 200 are disposed in an array extending over a terminal-region of said substrate and wherein at least some of the first portions 181 of the connection sections extend over the bottom surface 160 of the substrate in a part of the terminal region. In FIG. 7, the terminals 200 over the extended portion 137b are electrically connected to the leads 170 on the second surface 160 by a via 175a through the substrate and by conductive leads (not shown) on the first surface 150 of the substrate 130. FIG. 7 further shows a lead detachment point 185' providing a releasble connection to the substrate at the end of the second portion of the connection section 183 remote from first portion 181. The detachment point 185' which may be created by the under-etching of the conductive or dielectric base material or the under-etching of the second surface 160 of the substrate 130 itself, as described above.

FIG. 12 shows a top view of a fan-in package, similar to the view show in FIG. 6B except that the chip 100 is smaller. This figure shows that the chip manufacturer can shrink the chip from its original size and yet the package can still maintain the same package size (as described above) and terminal 200 pitch. The charge in the chip is accommodated by selectively moving the anchor portions 175 of the leads 170 so that the connection sections 180 can maintain the same length as they had in the original package. The chip 100 in this embodiment is not centered in the package thus allowing the substrate to only have to be partially re-designed on one side so that the anchor portions reside further in towards the center section 137 of the substrate 130. The chip contacts 110 on both bonding sides of the package are aligned with the original connection section 180 locations. The ability to move the chip 100 around under the package substrate 130 adds significantly to the ability of the package to accept chip 100 shrinks without the need to change the terminal 200 locations.

Thus, this aspect of the invention provides a way of making packaged chips all having the same terminal pattern, using chips of different sizes. A first set of packaged chips is made according to FIG. 6, whereas a second set of packaged chips is made according to FIG. 12. The terminals in both sets of packaged chips are disposed in the same preselected pattern, so that the chips of both sets can be mounted to the same printed circuit boards or other substrates. Comparing FIG. 6B with FIG. 12, both sets of packaged chips have the same number of terminal rows (4 rows) disposed in a region of the substrate 130 overlying the chip front surface between the rows of contacts 110 on the chip. As the terminal patterns are the same in both sets, the distance $D_f$ between the front rows of terminals 200a closest to the contact rows 110 is the same in both sets, i.e., the same in FIG. 12 as in FIG. 6B. However, the inter-contact spacing $D_{c2}$ between the rows of contacts 110 in the chips of the second set (FIG. 12) is smaller than the inter-contact spacing $D_{c1}$ between rows of contacts 110 in the chips of the first set. Therefore, the spacing $S_{2R}$ between the right-hand front row 200a' and the adjacent row of contacts 110 in the second set (FIG. 12) is less than the corresponding spacing $S_{1R}$ in the first set (FIG. 6). In going from the configuration of the first set to the configuration of the second set, the reduction in inter-contact spacing has been applied asymmetrically. Thus, the spacing $S_{2L}$ between the left-hand front row of contacts in the second set and the adjacent row of contacts 110 is the same as the corresponding spacing $S_{1L}$ in the first set. In the second set, the spacings between front rows of terminals are unequal, i.e., $S_{2L}$ is greater than $S_{2R}$.

Figure 13:
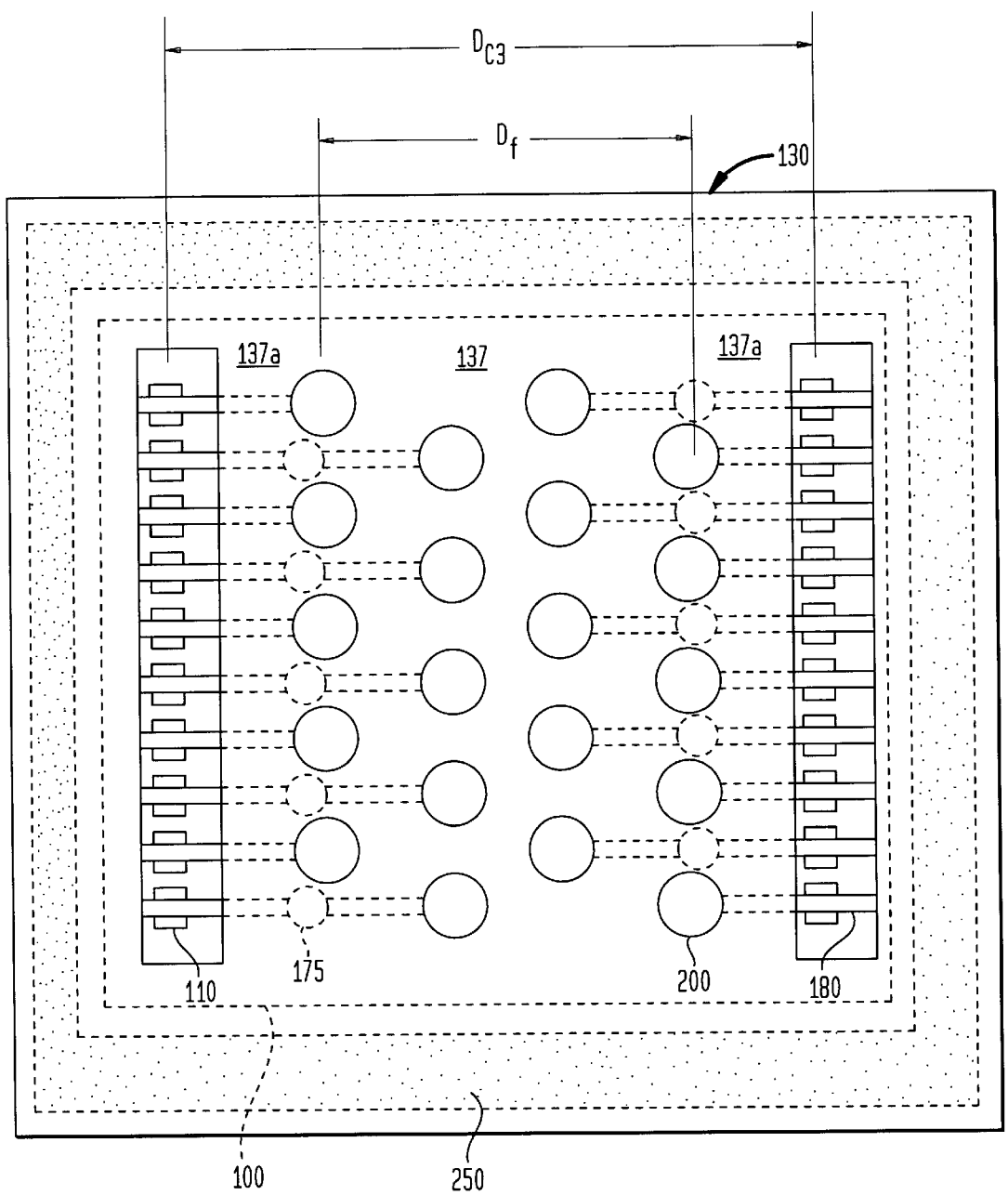

FIG. 13 shows a top view of a fan-in package in a third set, similar to the view shown in FIG. 12 except that the chip 100 is still smaller. This figure shows the chip 100 after the chip manufacturer has performed another chip shrink so that the inter-contact spacing $Dc_{C3}$ of the third set is even smaller than the intercontact spacing of the second set (FIG. 12). FIG. 13 also shows the ability of the package to maintain its original size and further maintain the same terminal 200 pitch by re-positioning the chip 100 in relation to the substrate 130 again and moving the anchor portions 175 of the leads 170 inwards so that the connection sections 180 on both sides of the package can maintain the same length as they had in the original package. Here again, the distance $D_f$ between front rows of terminals remains the same. Of course, the designations "first set", "second set" and "third set" are used arbitrarily in the foregoing discussion. Thus, the process may begin with assembly of the set of packaged chips referred to as the "second set" above, in which case the set of packaged chips referred to above as the "third set" would constitute the second set of packaged chips.

In this embodiment, the chip 100 has gotten so small that an at least somewhat rigid extender ring 250 is placed around the chip, as described in more detail in U.S. patent application Ser. Nos. 09/067,310 and 09/067,698 incorporated herein by reference. Alternatively, a ring of encapsulant material can be substituted for the ring 250. The encapsulant material can be rigid or compliant; however, the wider the encapsulant ring (measured laterally from the edge of the die), typically, the more desirable it is for the encapsulant material to have more rigid characteristics so that it is easier to handle the parts during socketing and assembly to a PWB. This is explained more fully in U.S. patent application Ser. Nos. 08/726,697 and 09/246,056, incorporated herein by reference.

Figure 14:
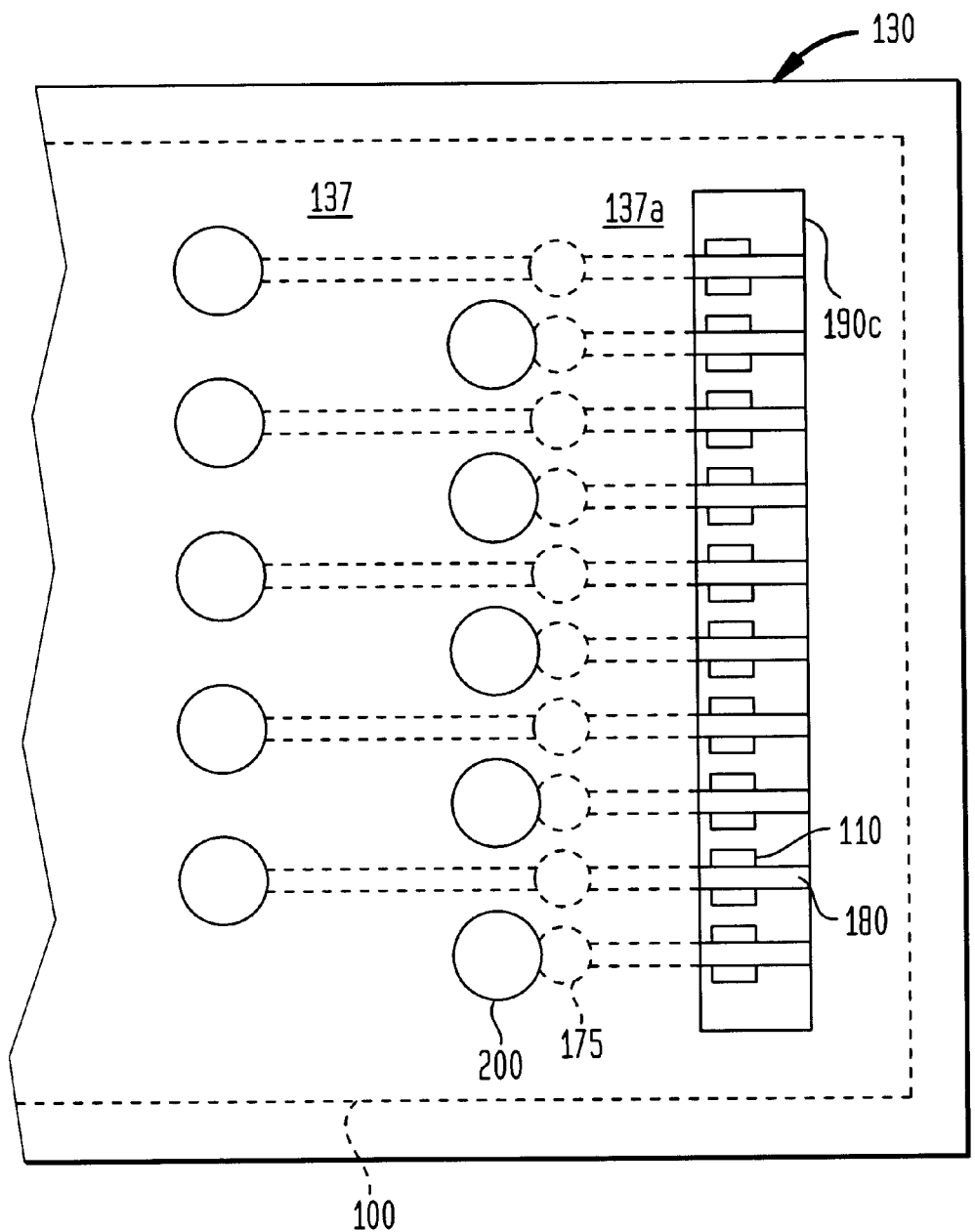
FIGS. 14 through 16 show fragmentary top plan view of a semiconductor chip package through two successive chip shrinks, according to the present invention.
Figure 15:
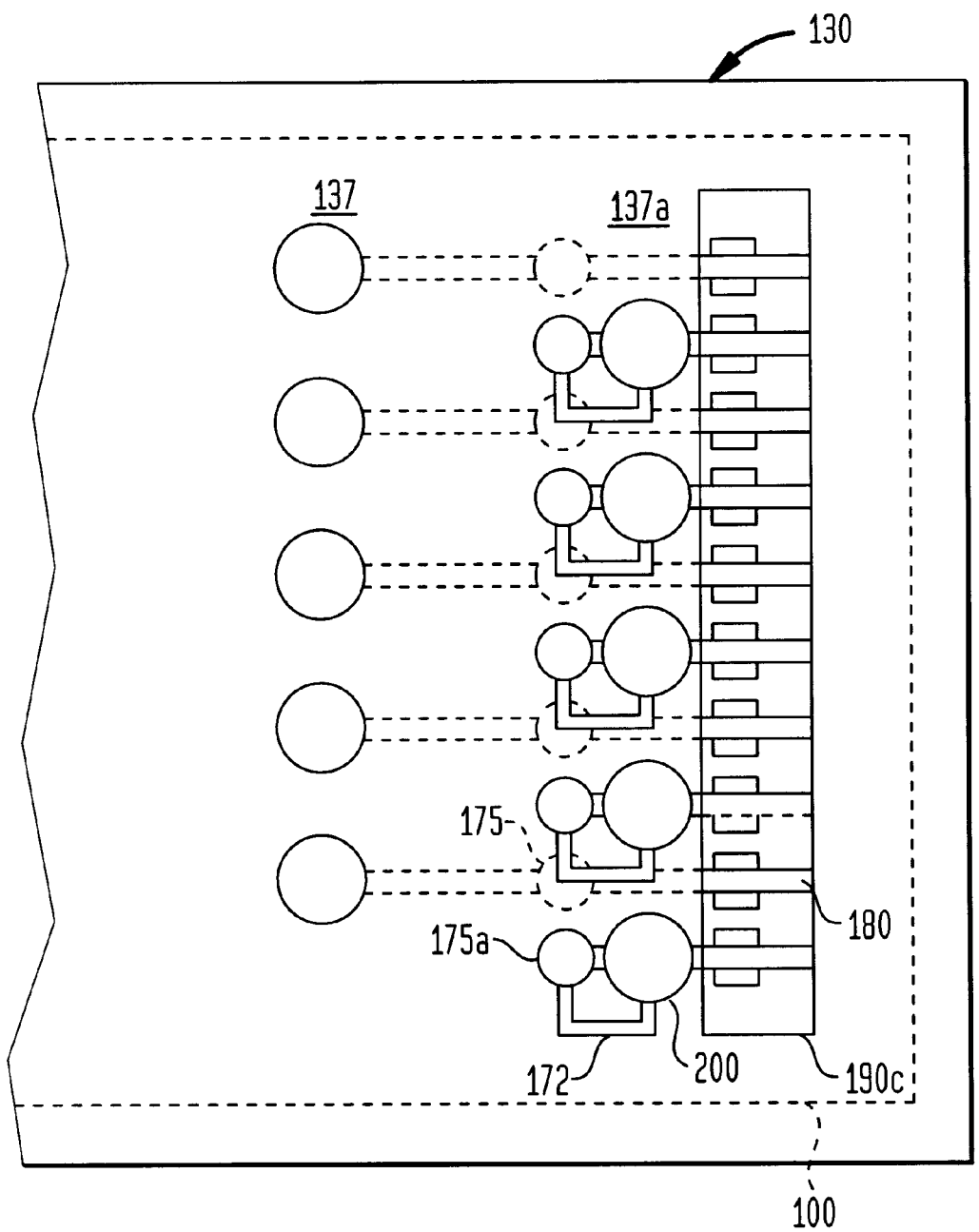
Figure 16:
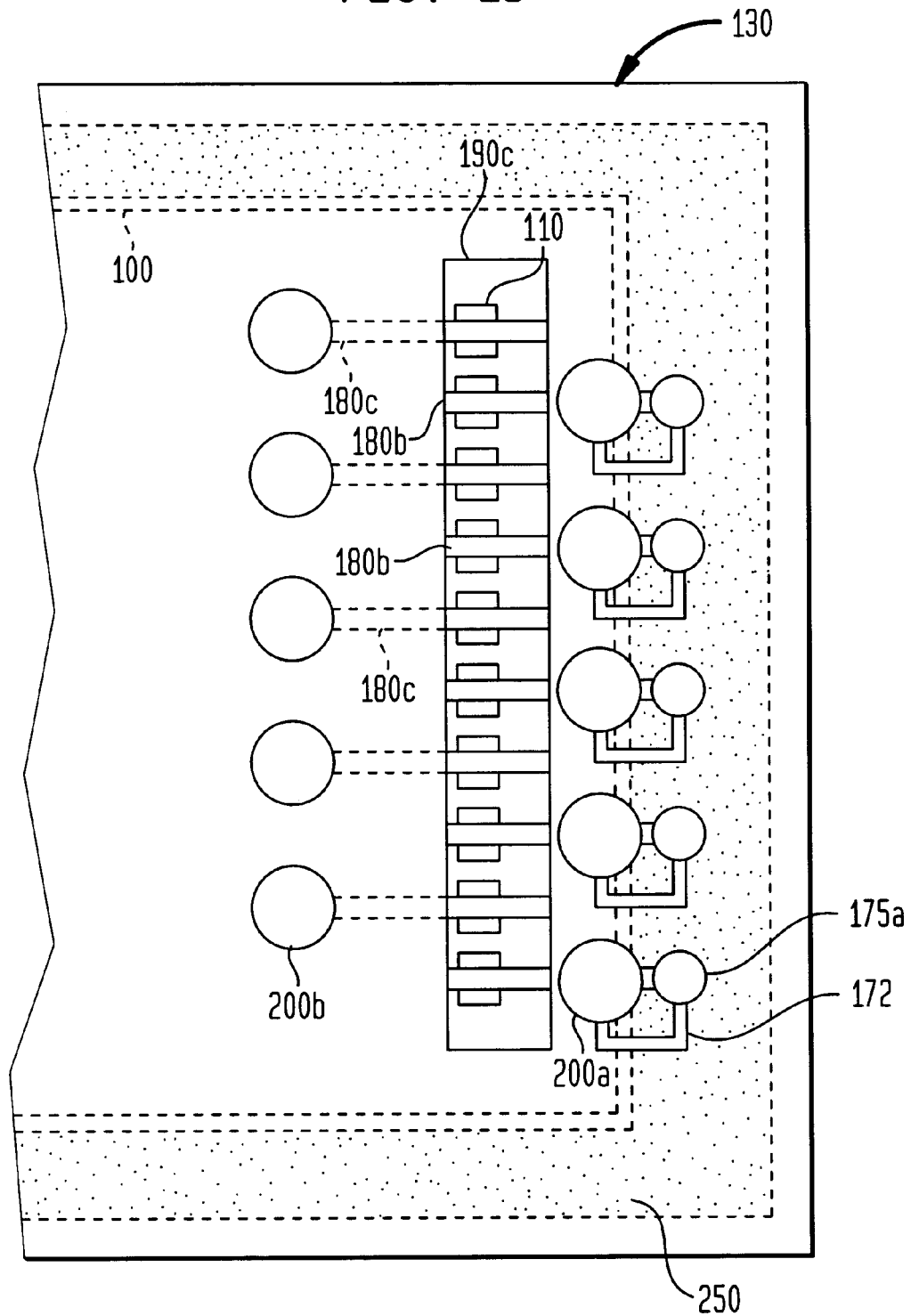

FIG. 14 shows a magnified fragmentary top view similar to that shown in FIG. 6B. FIG. 15 shows a fragmentary magnified top view after one chip 100 shrink where the package periphery has been minimized with the minimization of the chip size. Also, the lead anchors 175 are located in a position past the terminals 200 such that the via 175a provides an electrical connection from the second surface 160 to the first surface 150 of the substrate 130 and a lead 172 provides the connection between the via 175a and the respective terminal 200 (note that the leads 172 preferentially would be connected to the terminals 180 in a more direct path). FIG. 16 shows a magnified fragmentary top view similar to that shown in FIG. 15 after yet another chip shrink. In this embodiment, however, the chip 100 has either gotten so small or has been re-centered such that the bonding window 190c has been re-located inward between the first set of terminals 200a and the second set of terminals 200b such that the first set of terminals 200a are at least partially located over the extender ring 250 or the encapsulant ring material, as discussed above. Stated another way, where N rows of terminals 200 were disposed between rows of contacts 110 in the packaged chips of FIG. 15, N-1 rows of terminals are disposed between the rows of contacts in the packaged chips of FIG. 16. The same process can be used with even greater shrinkage, corresponding to two or more rows of chips. Thus, where the packaged chips of one set have N rows of terminals disposed between the rows of contacts, the packaged chips of another set may have (N–M) rows of terminals disposed between the rows of contacts. As also stated above, the leads 172 preferentially would be connected to the terminals 180 in a more direct path then that shown. The connection sections 180b and 180c would each detach near the side of the bonding window 190c furthest from their respective terminals 200. Thus, using the methods and structures described herein, FIG. 16 shows that a fan-in only package design (where all of the terminals 200 are located over the chip face surface 120 in the area between rows of contacts) can become a fan-in/fan-out package design (where the terminals are located both over the chip face 120 and beyond the rows of contacts, such as beyond the periphery of the chip 100).

Figure 17:
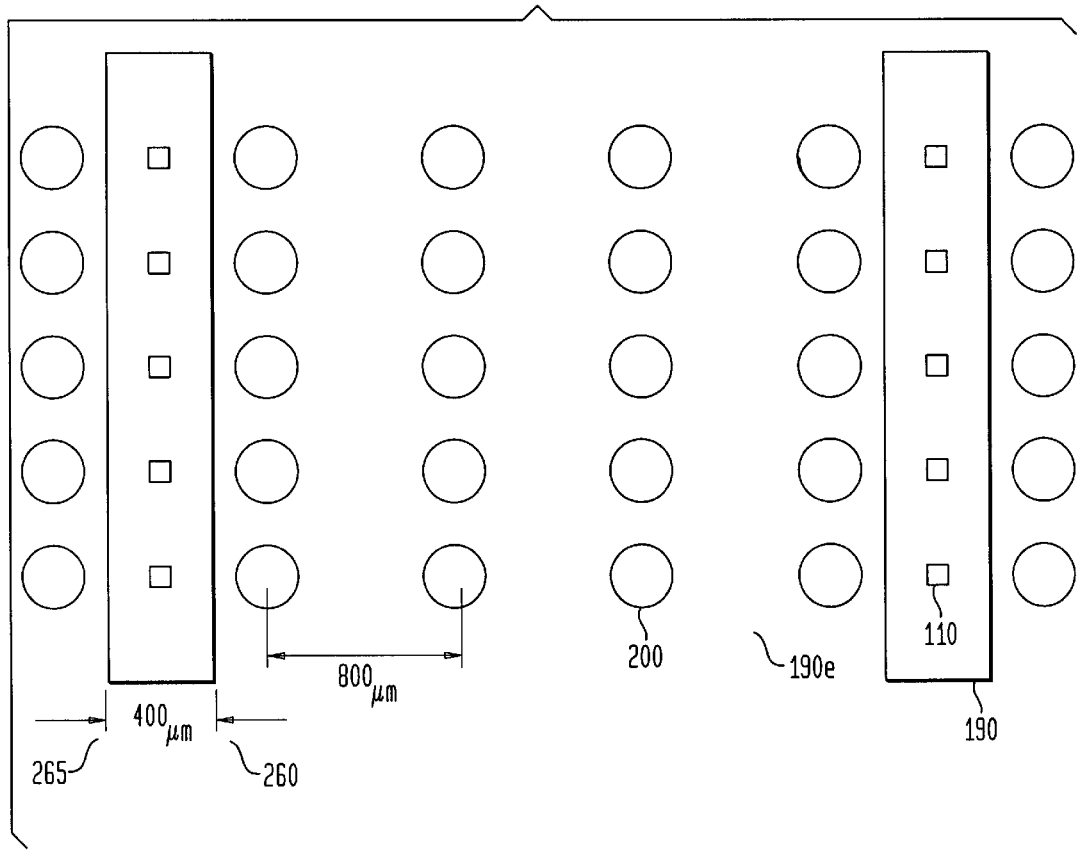
FIG. 17 shows some general design guidelines with respect to effectively handling successive chip shrinks while keeping the same pitch between adjacent substrate terminals.

FIG. 17 shows some general design guidelines with respect to effectively handling successive chip 100 shrinks while keeping the same pitch between adjacent terminals 200. If it is assumed that (1) the connection sections 180a/180b of each of the leads 170 are allowed to release from the second surface 160 of the substrate 130, (2) that the chip may be moved back and forth underneath the substrate such that the chip 100 is not necessarily centered under the substrate 130, and (3) that the width dimension of the bonding window 190 is either narrow enough to be able to be moved around between the rows of terminals in registration with the chip contacts 110 or is wide enough such that the chip contacts can be moved within the bonding window (due to a chip shrink) approximately half the distance of the terminal pitch, then the substrate 130 should be able to package any chip shrink. For this example, a terminal pitch of 800 $\mu$m was selected for a package design that is initially a fan-in/fan-out type package. The bonding window 190 is larger than one half the terminal pitch (400 $\mu$m in this example) such that the chip contacts 110 can be moved at least one-fourth of the total terminal 200 pitch inwardly or outwardly from a central position in the bonding window. As the chip shrinks, the anchor portions 175 of the leads 170 can be moved inwardly over the substrate 130 and the connection sections 180 of the leads 170 can be made to release from the second surface 160 of the substrate 130 (as described above) at one or both bonding windows 190. The chip 100 may be moved around under the substrate 130 to better align the contacts 110 with the bonding windows 190. At the point that the chip 100 shrinks enough that the contacts 110 on both sides are beyond the inner most bonding boundary 260 in the bonding window 180, the substrate 130 can be designed such that one of the bonding windows 190e is positioned between the next two rows of terminals 200 and the chip 100 can be repositioned asymmetrically under the substrate 130 such that the chip contacts are juxtaposed within the bonding windows 190 and 190e. Since the distance between the outer most bonding boundary 265 and the innermost bonding boundary 260 is at least half the distance of the terminal pitch and since the terminal diameter (if the terminals are circular) is typically approximately 250 $\mu$m to 300 $\mu$m, the contacts 110 can be repositioned within the new boundaries 260 and 265 of each of the bonding windows 190, 190e. This re-positioning of the bonding window can be performed any number of times in response to further chip shrinks. It is believed that such chip shrink guidelines work for all face down package types. The process thus provides successive sets of packaged chips.

Figure 18:
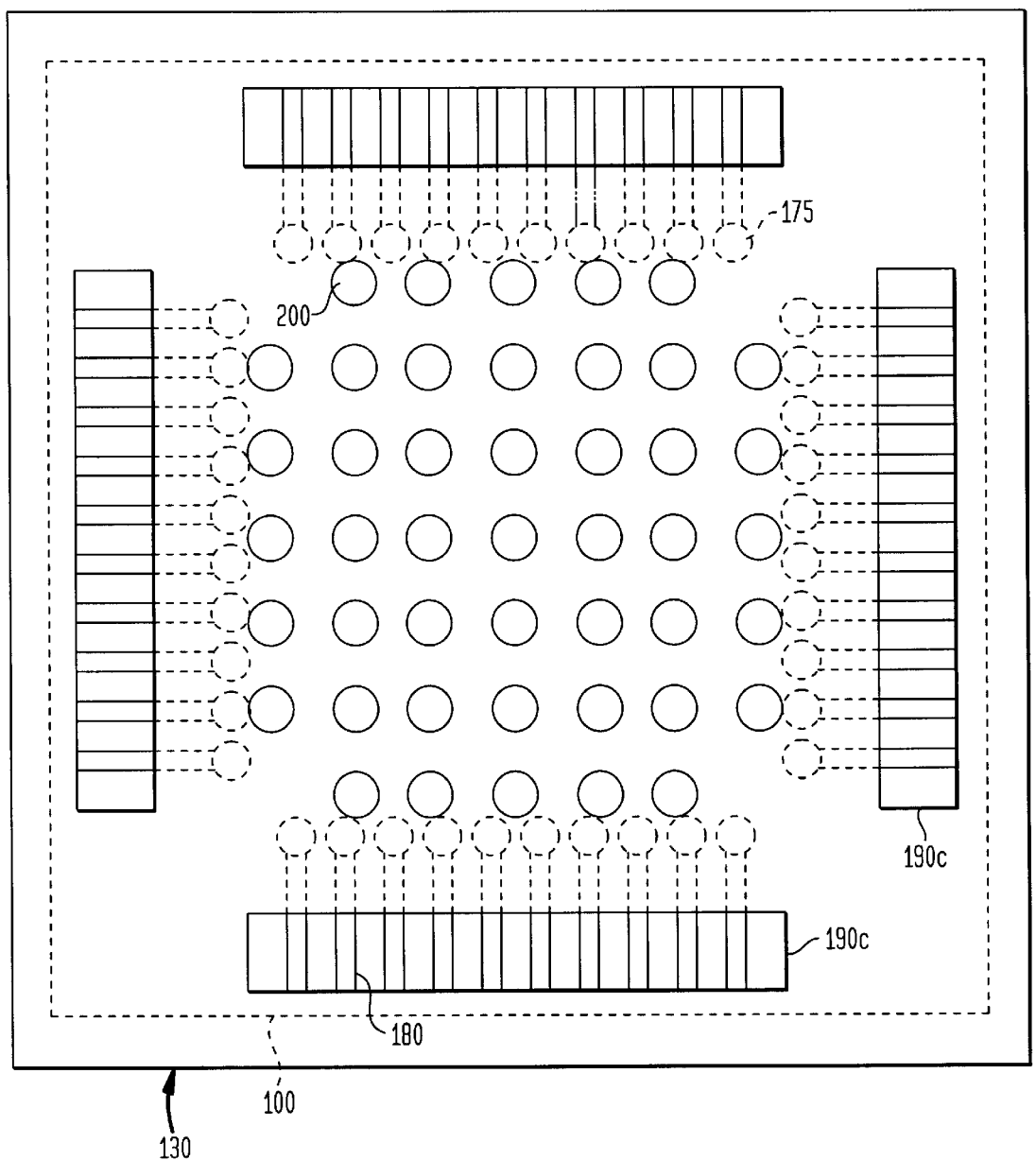
FIG. 18 shows a top plan view of a semiconductor chip package having four substrate apertures, according to the present invention.

FIGS. 18–21 show further embodiments of the present invention. In FIG. 18, the chip 100 has chip contacts (not shown) on all four peripheral regions of the face surface 120, instead of just on two opposing regions as shown in the above embodiments. Likewise, the bonding windows 190c are juxtaposed with the chip contacts on all four peripheral sides of the chip 100 such that the connection sections 180 are aligned with each of the chip contacts 110. As the semiconductor manufacturer shrinks the size of the chip 100, the lead anchors 175 can be moved inwardly towards the center of the substrate 130, the chip may be moved such that it is not centered with the substrate and/or the bonding windows 190c may be narrowed or may be positioned between the next inward successive terminal 200 rows changing the chip package from a fan-in only design to a fan-in/fan-out design (as shown in FIG. 17). As the variations of the chip 100 continue to be made smaller, an extender ring or encapsulant ring 250 may be added around the periphery of the chip 100 to support the outer-most terminals, as described in the embodiments above.

Figure 19:
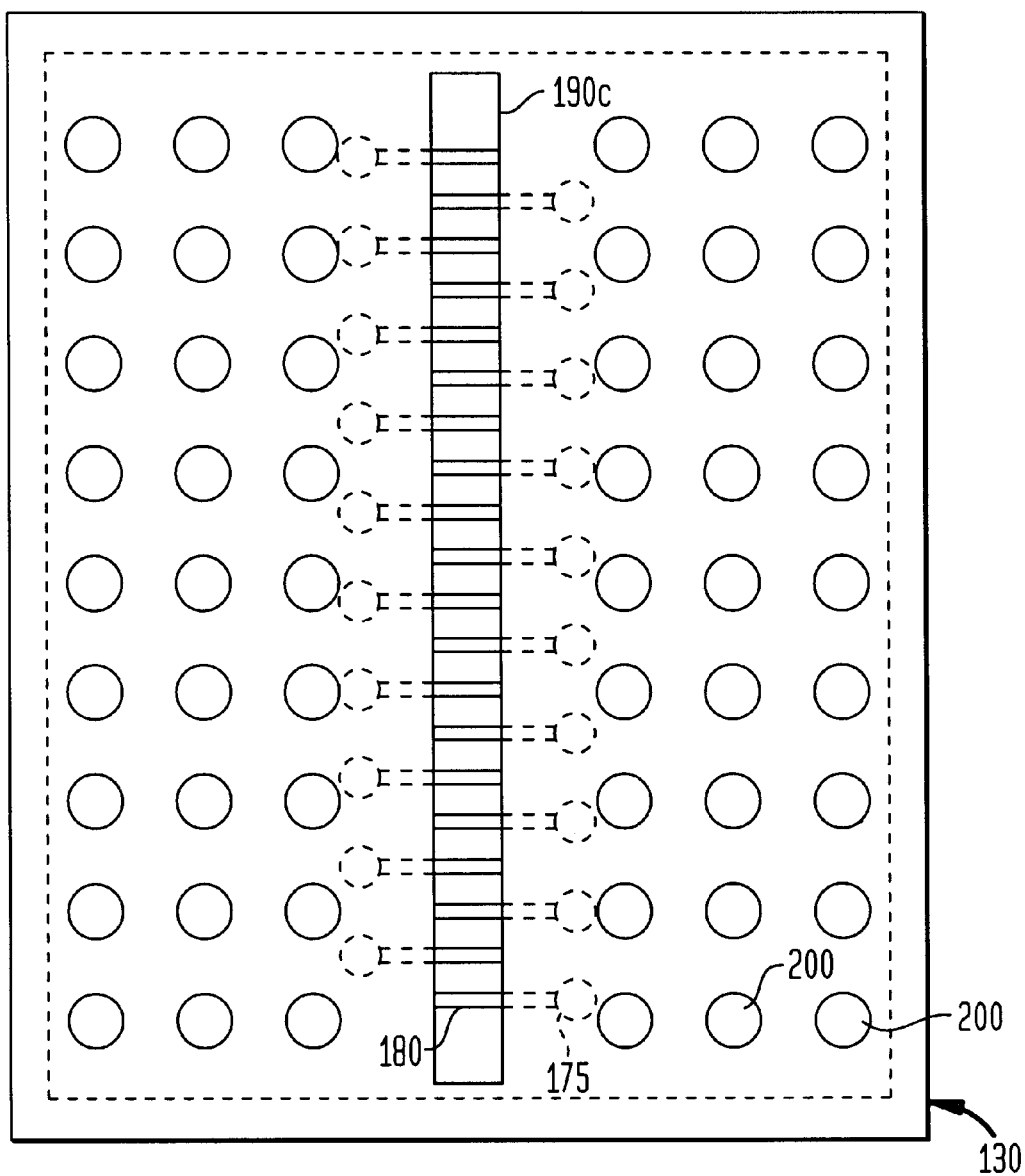
FIG. 19 shows a top plan view of a semiconductor chip package having a single substrate aperture and centrally located chip contacts.

In FIG. 19, the chip 100 has contacts (not shown) in one or more columns positioned in the center of two opposing sides of the chip 100. The bonding window 190c is juxtaposed with the chip contacts 110 such that the connection sections 180 are aligned with each of the chip contacts 110 and the terminals 200 are located on either side of the bonding window 190c. In this chip package embodiment, the bonding window 190c may be narrowed by re-positioning the lead anchor 175 (as described above and shown in this figure) to allow the pitch of the terminals 200 to be condensed. In certain embodiments, the bonding window could be made small enough (such as is shown in FIG. 7) to fit between successive rows of terminals 200 so that the terminals 200 may be arranged in a common pitch grid array throughout the first surface 150 of the substrate 130. As the variations of the chip 100 continue to be made smaller, an extender ring or encapsulant ring 250 may be added around the periphery of the chip 100 to support the outer-most terminals, as described in the embodiments above.

Figure 20:
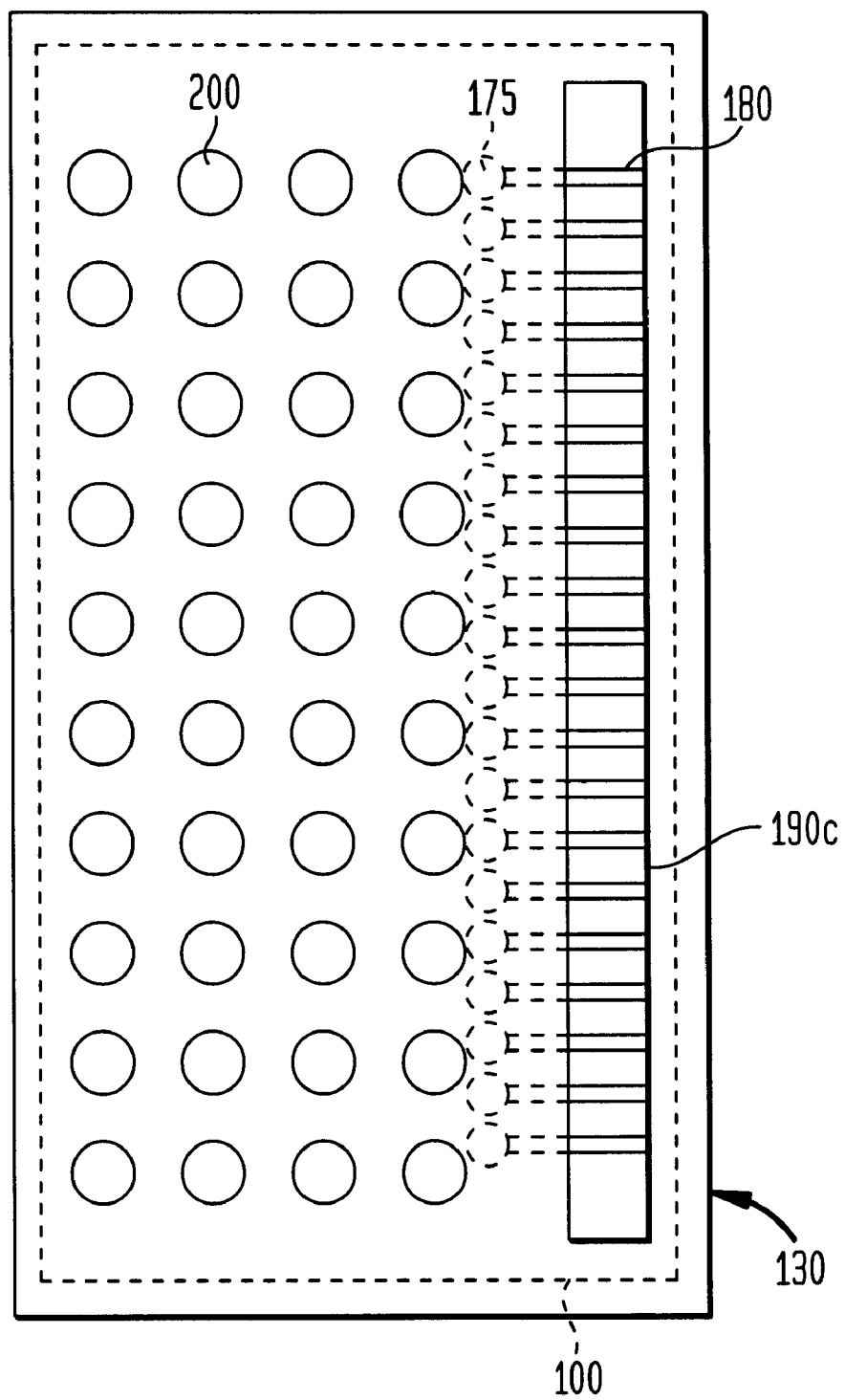
FIG. 20 shows a top plan view of a semiconductor chip package having a single substrate aperture and peripherally located chip contacts.

In FIG. 20, the chip 100 has contacts (not shown) located in one or more columns positioned on one side of the chip periphery. The bonding window 190c is juxtaposed with the chip contacts 110 such that the connection sections 180 are aligned with each of the chip contacts 110 and the terminals 200 are located on one side of the bonding window 190c over the chip face surface 120. As the semiconductor manufacturer shrinks the size of the chip 100, the terminal 200 pitch of the original package can be maintained by moving the lead anchors 175 inwardly towards the opposing periphery of the chip 100, moving the chip such that it is not centered with the substrate and/or narrowing the bonding window. Alternately, if the chip 100 becomes much smaller than the original chip size, the bonding window 190c may be repositioned between the next inward successive terminal 200 rows changing the chip package from a one-sided fan-in only design to a limited fan-in/fan-out design. As the variations of the chip 100 continue to be made smaller, an extender ring 250 may be added around the periphery of the chip 100 to support the outer-most terminals, as described in the embodiments above.

Figures 21, 22:
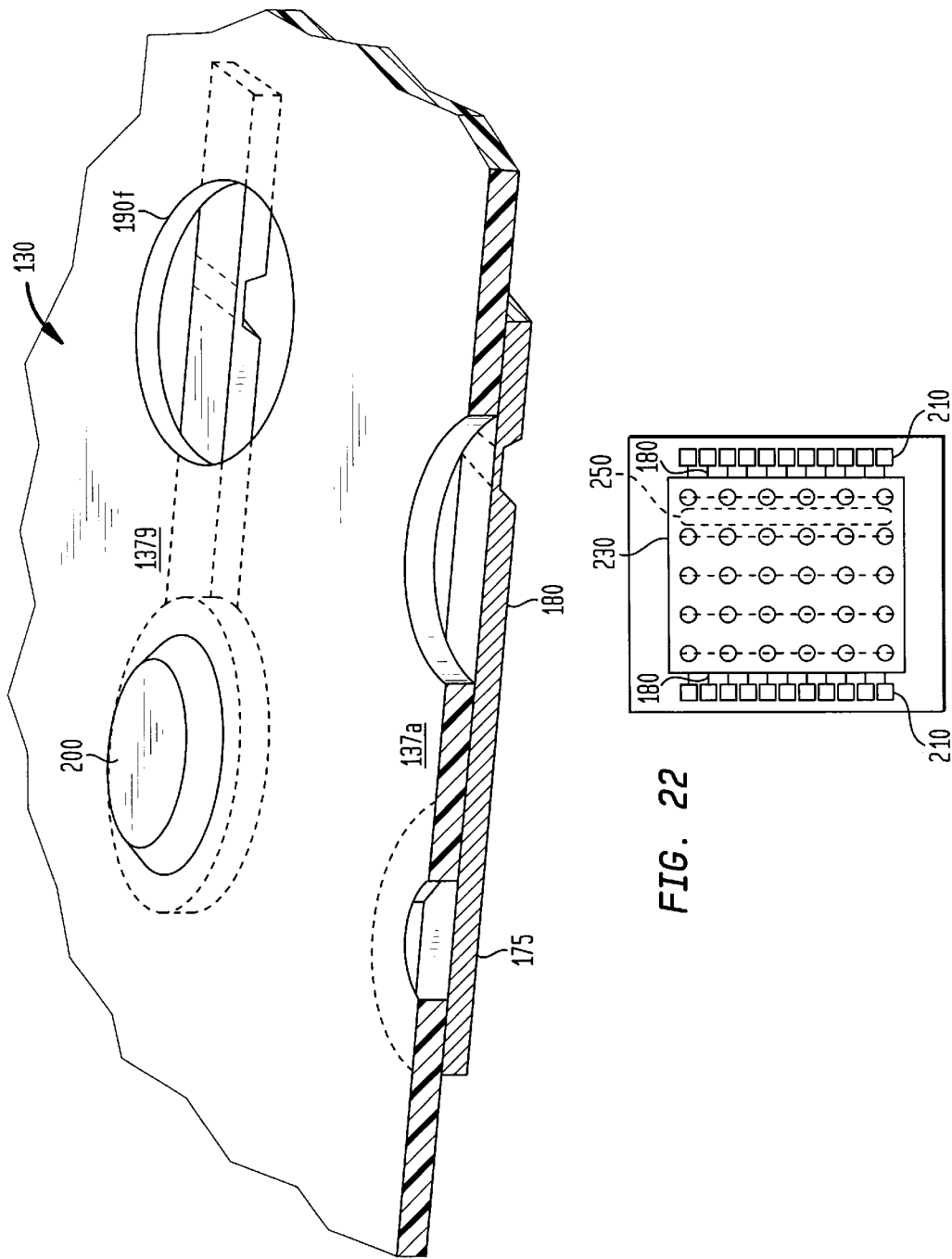
FIG. 21 shows a perspective, fragmentary view of a semiconductor chip package having such that each connection section of an electrical lead spans an individual respective substrate aperture.
FIG. 22 is a diagrammatic plan view depicting a chip package according to yet another embodiment of the invention.

FIG. 21 shows a perspective, fragmentary view of yet another embodiment. This embodiment shows that the long bonding windows shown in the above embodiments may be made smaller such that each connection section 180 spans an individual respective bonding window 190f. Such an embodiment could be used no matter where the chip contacts 110 are located; however, this type of embodiment would preferably be used where the chip contacts 110 are located in somewhat of a random locations or in an area array grid across the face surface 120 of the chip 100. In an embodiment where the chip contacts 110 are located in the central region of the chip 100, the extended portion 137a of the substrate 130 would be located above a portion of each respective connection section 180 of each lead 170. In further variations to the embodiment shown in FIG. 21, the connection sections 180 of the leads 170 may not extend straight across the bonding window 190f, i.e. the leads may be formed with one or more lateral bends or curves therein, may be formed in the shape of a spiral, etc.

It is also possible that the methods and structures described herein could also be applied to a fan-out, tape automated bonding (TAB) type embodiment (FIG. 22) to minimize the total overall package dimensions. In such an embodiment, the connection sections 180 may project outwardly from a central dielectric substrate 230, and need not project over an aperture in the substrate. Such a system can accommodate some die shrink by bringing the contact rows 210 closer to the outermost or front rows of terminals 220. Additional die shrink can be accommodated by providing one or more apertures 250 in the substrate and positioning some or all of the connection sections over the apertures. In further alternate embodiments, the bonding windows can have a reinforcing material around the boundary of each window. Typically, such a reinforcing material would be made of the same material as the leads 170 (such as copper or gold) so that it can be made at the same time as the leads are created (either by a subtractive method, an additive method or a combination of the two methods). The reinforcing material would add a small amount of localized rigidity to the substrate 130 around the bonding windows to reduce the amount of substrate flexure during the lead detachment and bonding operation performed on the connection sections 180.

The measures discussed above for accommodating die shrink can also be applied in reverse to accommodate for die growth. Die growth, where the same chip is modified to occupy a larger space, almost never occurs within a single chip fabrication facility. However, die growth could occur when production of a particular chip is shifted to a less-advanced wafer fabrication facility using larger feature sizes.

None of the figures described above have been drawn to scale so no measurements should be taken from the figures to determine the relative size of the elements contained therein. Variations and combinations of the features described above can be utilized without departing from the present invention as defined by the claims. The foregoing description of preferred embodiments should be taken by way of illustration rather than by way of limitation of the claimed invention.

What is claimed is:

1. A method of electrically connecting a substrate to a semiconductor chip contact comprising:

providing a semiconductor chip having contacts on a face surface;

providing a dielectric substrate having a top surface facing away from the face surface of the chip and a bottom surface facing towards the face surface of the chip and an aperture therethrough, said dielectric substrate further having a terminal exposed at said top surface, said substrate further having a connection section adjacent a portion of the bottom surface of the substrate and being releasably connected thereto or displaceably disposed thereon, said connection section further extending at least partially across the substrate aperture, said connection section being connected to said terminal by a conductive lead; and aligning said chip and said substrate such that said contacts are disposed within said substrate aperture and displacing and bonding said connection section to a chip contact, wherein the connection section is moved away from said substrate bottom surface toward the face surface of the chip during the displacement operation.

2. The method as claimed in claim 1, wherein the substrate further has an anchor between said leads and said connection sections, said anchor having a greater adherence to the surface of the substrate than the connection section.

3. The method as claimed in claim 2, wherein said anchor has a larger surface area per unit length than said connection section in contact with said substrate bottom surface than said connection section.

4. The method as claimed in claim 2, wherein said anchor is a conductive via extending from the bottom surface to the top surface of the substrate.

5. The method as claimed in claim 1, further including the step of removing a portion of material from between the connection section and the substrate bottom surface.

6. The method as claimed in claim 5, further including etching the substrate bottom surface.

7. The method as claimed in claim 6, wherein said substrate is preferentially etched in the area of said connection sections.

8. The method as claimed in claim 7, wherein the etching operation is performed using a plasma gas.

9. The method as claimed in claim 5, further including providing a layer between the connection section and the substrate bottom surface.

10. The method as claimed in claim 9, wherein said layer is a conductive layer.

11. The method as claimed in claim 10, wherein said layer is a copper layer.

12. The method as claimed in claim 9, wherein said layer is a dielectric layer.

13. The method as claimed in claim 12, wherein said layer is an adhesive layer.

14. The method as claimed in claim 1, wherein said chip and said substrate each have a central point which are not in alignment with each other.

15. The method as claimed in claim 1, wherein a plurality of connection sections extend at least partially across the substrate aperture, said connection sections being connected to respective substrate terminals by conductive leads, said connection sections being aligned, displaced and bonded with contacts on the face surface of the chip, wherein the connection sections are moved away from said substrate bottom surface toward the face surface of the chip during the displacement operation.

16. A method of compensating for semiconductor chip shrink comprising:
    providing a semiconductor chip having a face surface with contacts thereon;
    providing a substrate having a top surface and a bottom surface and at least two apertures therethrough, said substrate having a plurality of terminals exposed at said top surface, said terminals having a known center to center distance between adjacent terminals; juxtaposing said semiconductor chip face surface with said substrate bottom surface, said substrate further having at least two apertures extending from said top to said bottom substrate surface, each said aperture having a length dimension measured in a direction parallel to a chip edge and a width dimension measured in a direction transverse to said chip edge, the locations and the width dimensions of said substrate apertures being designed so that said chip contacts are disposed within one such aperture, said substrate further having a connection section adjacent a portion of the bottom surface of the substrate and being releasable connected thereto or displaceable therefrom, said connection section further extending at least partially across the substrate aperture such that it is in general alignment with a chip contact, said connection section being connected to said terminal by a conductive lead; and, displacing and bonding said connection section to a chip contact, wherein the connection section is moved away from said substrate bottom surface toward the face surface of the chip.

17. The method as claimed in claim 16, wherein said chip and said substrate each have a central point which are not in alignment with each other.

18. The method as claimed in claim 16, further including the step of removing a portion of material from between the connection section and the substrate bottom surface.

19. The method as claimed in claim 18, further including etching the substrate bottom surface.

20. The method as claimed in claim 19, wherein said substrate is preferentially etched in the area of said connection sections.

21. The method as claimed in claim 20, wherein the etching operation is performed using a plasma gas.

22. The method as claimed in claim 18, further including providing a layer between the connection section and the substrate bottom surface.

23. The method as claimed in claim 22, wherein said layer is a conductive layer.

24. The method as claimed in claim 23, wherein said layer is a copper layer.

25. The method as claimed in claim 22, wherein said layer is a dielectric layer.

26. The method as claimed in claim 25, wherein said layer is an adhesive layer.

27. A method of packaging a semiconductor chip comprising:
    providing a dielectric substrate having a top surface facing away and a bottom surface facing towards the face surface of the chip and an aperture therethrough, said dielectric substrate further having a terminals exposed at said top surface, said substrate further having connection sections adjacent a portion of the bottom surface of the substrate and being releasably connected thereto or displaceable therefrom, the connection sections further extending partially across said substrate aperture, said connection sections being connected to said terminal by a conductive lead; and
    juxtaposing a semiconductor chip having contacts on a face surface with the substrate aperture such that said contacts are disposed within the substrate aperture;
    displacing and bonding said connection sections to said chip contacts, wherein the connection sections are moved away from said substrate bottom surface toward the face surface of the chip.

28. A method of connecting a substrate to a semiconductor chip which compensates for successive shrinks of the chip comprising:
    providing a substrate that has connection sections of electrical leads that are releasable or displaceable from a surface of the substrate as a result of a force from a bonding tool on the connection sections through at least one substrate aperture;
    aligning a semiconductor chip with the substrate so that the connection sections are in general alignment with the chip contacts;

displacing and bonding to respective chip contacts.

29. The method as claimed in claim 28, wherein the chip is asymmetrically aligned with the substrate and the location and dimensions of the substrate aperture is designed so that the connection sections can be in alignment with the chip contacts.

30. A method of making a plurality of packaged semiconductor chips all having terminals disposed in the same pattern comprising:

(a) providing a first set of semiconductor chips having contacts disposed in a first contact pattern and a first set of connection components, each connection component of the first set having a dielectric substrate having a top surface and a bottom surface and having terminals accessible at said top surface in a preselected pattern, and having connection sections disposed on said substrate, each said connection section having a first portion and a second portion, at least the second portion of each said connection section being displaceable downwardly with respect to said substrate, the second portions of said connection sections being electrically connected to said terminals through said first portions;

(b) joining said connection components of said first set to said chips of said first set to form a first set of packaged chips, the joining step for each such packaged chip including: assembling a connection component of the first set to a chip of the first set so that the component is supported over the chip with said bottom surface of the dielectric substrate spaced above said chip, with at least some of the terminals on the component overlying the chip, and with said second portions of said connection sections at least approximately aligned with contacts on the chip, and displacing said second portions of the leads downwardly into engagement with the contacts on the chip;

(c) providing a second set of semiconductor chips having contacts disposed in a second contact pattern different from said first contact pattern and a second set of connection components, each connection component of the second set having a dielectric substrate having top and bottom surfaces and having terminals accessible at said top surface in said preselected pattern, and having connection sections disposed on said substrate, each said connection section having a first portion and a second portion, at least the second portion of each said connection section being displaceable downwardly with respect to said substrate, the second portions of said connection sections being electrically connected to said terminals through said first portions;

(d) joining said connection components of said second set to said chips of said second set to form a second set of packaged chips, the joining step for each such packaged chip of the second set including: assembling a connection component of the second set to a chip of the second set so that the component is supported over the chip with said bottom surface of the dielectric substrate spaced of the component above said chip, with at least some of the terminals on the component overlying the chip, and with said second portions of said connection sections at least approximately aligned with contacts on the chip, and displacing said second portions of the leads downwardly into engagement with the contacts on the chip.

31. A method as claimed in claim 30 wherein said chips of said second set are smaller than said chips of said first set.

32. A method as claimed in claim 30 wherein said first contact pattern includes two rows of contacts extending generally parallel to one another at a first inter-contact distance and said second contact pattern includes two rows of contacts extending generally parallel to one another at a second inter-contact distance smaller than said first inter-contact distance.

33. A method as claimed in claim 32 wherein each of said connection components includes two rows of connection section second portions extending in a row direction, the connection section second portions in each said row extending generally side-by-side in a direction transverse to the row direction, and wherein the connection components are assembled to the chips so that the row directions of the components are substantially parallel to the row directions of the chips and so that each row of connection section second portions overlies one row of chip contacts.

34. A method as claimed in claim 33 wherein, during joining of the connection components of the second set to the chips of the second set, at least some of the first portions of said connection sections are at least partially displaced away from the dielectric substrates as the second portions of the connection sections are displaced downwardly.

35. A method as claimed in claim 33 wherein said preselected terminal pattern includes rows of terminals extending substantially parallel to the row directions of the connection components.

36. A method as claimed in claim 35 wherein N rows of terminals in said preselected pattern lie between the rows of connection section second portions in said connection components of said first set and (N–M) rows of terminals in said preselected pattern lie between the rows of connection section second portions in said connection components of said second set, N and M being positive integers.

37. A method as claimed in claim 35 wherein M is 1 and N is greater than 2.

38. A method as claimed in claim 35 wherein N rows of terminals in said preselected pattern lie between the rows of connection section second portions in said connection components of said first set and N rows of terminals in said preselected pattern lie between the rows of connection section second portions in said connection components of said second set, N being a positive integer greater than 1, whereby the rows of terminals in said connection components of each said set will include two front rows of terminals which are disposed immediately adjacent the rows of contacts on the chip when the connection components are joined to the chips, at least one of the front rows of terminals on the components of said second set being disposed closer to a row of contacts on the chip than the same front row of terminals on the components of the first set.

39. A method as claimed in claim 38 wherein, during joining of the connection components of the second set to the chips of the second set, at least some of the first portions of said connection sections are at least partially displaced away from the dielectric substrates as the second portions of the connection sections are displaced downwardly.

40. A method as claimed in claim 38 wherein the front rows of terminals on the connection components of one said set are disposed at unequal distances to said rows of contacts on the chips of that set.

41. A method of electrically connecting a component to a semiconductor chip, wherein said component comprises a dielectric substrate having a top surface, a bottom surface and terminals exposed at said top surface, a plurality of elongated connection sections on said substrate, each said connection section having a first portion overlying said bottom surface of said dielectric substrate and a second portion projecting from said substrate, said second portions of said connection sections being electrically connected to said terminals through said first portions of said connection sections, said first and second portions of said connection sections being displaceable downwardly away from said substrate, said method comprising:

(a) supporting said component over said chip with said bottom surface of said dielectric substrate spaced above said chip and with said second portions of said connection sections at least approximately aligned with contacts on the chip; and (b) engaging said second portions of said connection sections with one or more bonding tools and displacing said second portions downwardly relative to said dielectric substrate into engagement with said contacts on said chip, at least some of said first portions of said connection sections being at least partially displaced away from said dielectric substrate as said second portions are displaced downwardly.

* * * * *

UNITED STATES PATENT AND TRADEMARK OFFICE
CERTIFICATE OF CORRECTION

PATENT NO. : 6,300,231 B1
DATED : October 9, 2001
INVENTOR(S) : Belgacem Haba and John W. Smith It is certified that error appears in the above-identified patent and that said Letters Patent is hereby corrected as shown below:

Title page,
Assignee, after "San Jose" insert --, CA. (US)--.

Column 4,
Line 10, "a-bottom" should read -- a bottom --.
Line 29, "show" should read -- shows --.

Column 8,
Line 25, "4" should read -- 6A --.
Line 33, "used-with" should read -- used with --.

Column 10,
Line 8, "terminal-region" should read -- terminal region --.

Column 11,
Line 9, "$Dc_{c3}$" should read -- $D_{c3}$ --.

Signed and Sealed this

Sixteenth Day of April, 2002

Attest:

JAMES E. ROGAN
*Attesting Officer*  *Director of the United States Patent and Trademark Office*